United States Patent
Nakamori

(10) Patent No.: US 9,225,233 B2
(45) Date of Patent: Dec. 29, 2015

(54) POWER CONVERSION DEVICE CONTROL DEVICE

(71) Applicant: FUJI ELECTRIC CO., LTD., Kawasaki (JP)

(72) Inventor: Akira Nakamori, Nagano (JP)

(73) Assignee: FUJI ELECTRIC CO., LTD. (JP)

( * ) Notice: Subject to any disclaimer, the term of this patent is extended or adjusted under 35 U.S.C. 154(b) by 360 days.

(21) Appl. No.: 14/021,544

(22) Filed: Sep. 9, 2013

(65) Prior Publication Data

US 2014/0009983 A1 Jan. 9, 2014

Related U.S. Application Data

(63) Continuation of application No. PCT/JP2012/002427, filed on Apr. 6, 2012.

(30) Foreign Application Priority Data

Apr. 8, 2011 (JP) .................................. 2011-086717

(51) Int. Cl.
*H02H 7/00* (2006.01)
*H02H 9/00* (2006.01)
(Continued)

(52) U.S. Cl.
CPC ................ *H02M 1/32* (2013.01); *H02M 1/084* (2013.01); *H03K 17/0828* (2013.01); *H03K 17/18* (2013.01)

(58) Field of Classification Search
CPC ........... H02M 1/32; H02H 9/025; H02H 3/08; H02H 3/20
USPC .................................................. 361/93.1, 18
See application file for complete search history.

(56) References Cited

U.S. PATENT DOCUMENTS 5,115,388 A * 5/1992 Shigekane ............. H02H 5/041
361/106
5,900,683 A 5/1999 Rinehart et al.
(Continued)

FOREIGN PATENT DOCUMENTS

EP 0708529 A2 4/1996
JP 02-164278 A 6/1990
(Continued)

OTHER PUBLICATIONS

Extended European search report issued in corresponding European Patent application No. 12768112 dated Mar. 25, 2015.
(Continued)

*Primary Examiner* — Dharti Patel
(74) *Attorney, Agent, or Firm* — Rossi, Kimms & McDowell LLP

(57) ABSTRACT

Aspects of the invention include a power conversion device control device, including multiple drive circuits having an alarm signal formation circuit that sets a pulse signal having as one cycle a period. The one cycle period includes a determination period, of which a different period is set for each of plural protection circuits that detect information for carrying out a protection operation of semiconductor elements configuring a power conversion device, and a constant period, in which a condition varies with respect to the determination period, takes a protection circuit for which it is first detected that a protection operation is necessary to be a first-come first-served protection circuit, and outputs the pulse signal corresponding to the first-come first-served protection circuit as an alarm signal, wherein the alarm signal formation circuit is such that a resetting condition of the alarm signal is a condition that a protection operation stopped condition.

20 Claims, 14 Drawing Sheets

(51) Int. Cl.
  H02M 1/32 (2007.01)
  H02M 1/084 (2006.01)
  H03K 17/082 (2006.01)
  H03K 17/18 (2006.01)
  *H02H 3/20* (2006.01)
  *H02H 9/02* (2006.01)

(56) References Cited

U.S. PATENT DOCUMENTS

| | | | |
|---|---|---|---|
| 6,038,683 A | 3/2000 | Shimamura et al. | |
| 6,404,659 B1 * | 6/2002 | Oyabe | H02M 1/08 318/811 |
| 6,459,380 B1 * | 10/2002 | Watanabe | H02M 1/32 340/635 |
| 8,564,913 B2 * | 10/2013 | Motohashi | H02H 7/122 361/18 |
| 2002/0039269 A1 | 4/2002 | Kumagai et al. | |
| 2003/0072117 A1 * | 4/2003 | Maekawa | H02M 1/08 361/86 |

FOREIGN PATENT DOCUMENTS

| | | |
|---|---|---|
| JP | 07-274485 A | 10/1995 |
| JP | 08-047262 A | 2/1996 |
| JP | 08-070580 A | 3/1996 |
| JP | 10-267977 A | 10/1998 |
| JP | 10-271834 A | 10/1998 |
| JP | 11-017508 A | 1/1999 |
| JP | 2000-032772 A | 1/2000 |
| JP | 2000-341960 A | 12/2000 |
| JP | 2002-027665 A | 1/2002 |
| JP | 2006-034029 A | 2/2006 |
| JP | 2007-082360 A | 3/2007 |
| JP | 2007-324828 A | 12/2007 |

OTHER PUBLICATIONS

International Search Report issued in PCT/JP2012/002427 dated Jul. 10, 2012.

* cited by examiner

FIG.9(a) INPUT VOLTAGE ALB OF 600
FIG.9(b) INPUT VOLTAGE PD OF 601
FIG.9(c) OUTPUT VOLTAGE Gc OF 604

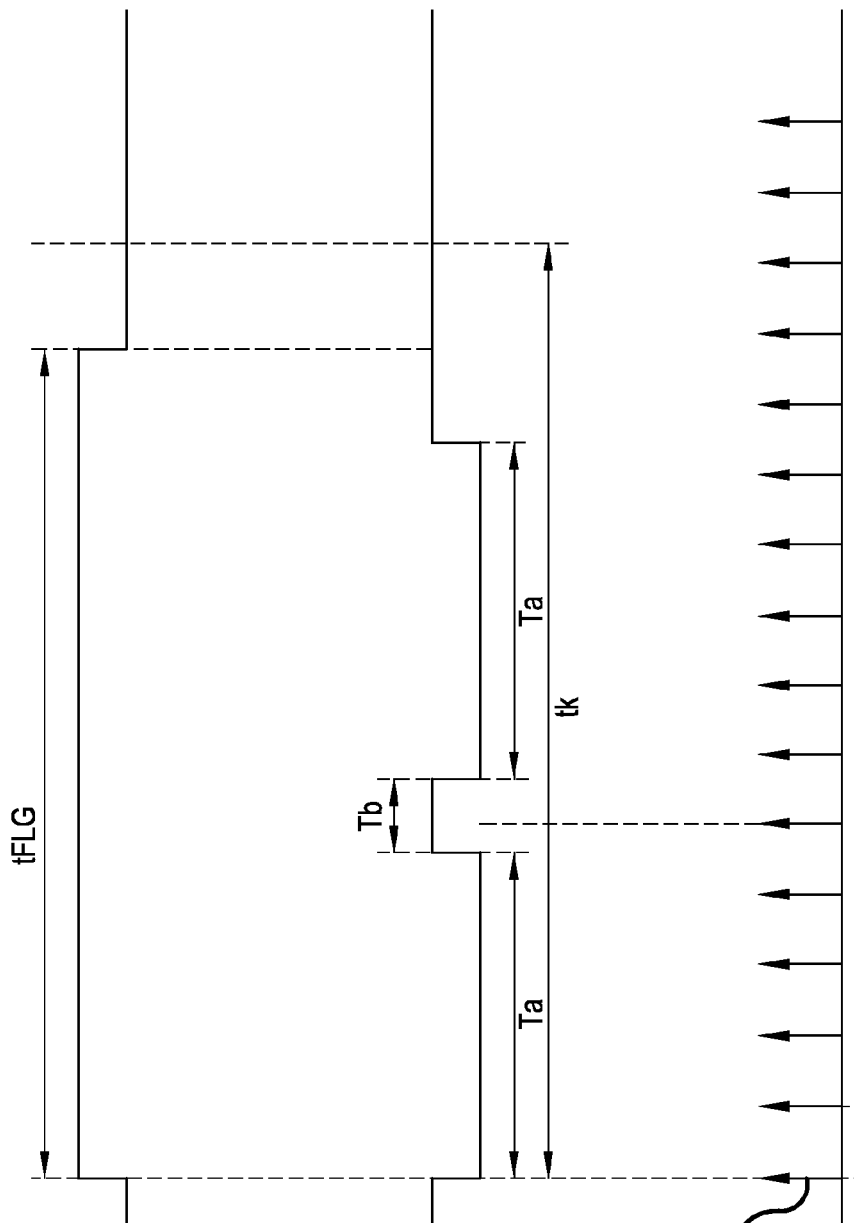
FIG.13(a) UV PROTECTION OPERATION FLAG (INTERNAL VOLTAGE OF IC 1)
FIG.13(b) ALARM OUTPUT AL (VOLTAGE OF TERMINAL 12)
FIG.13(c) TIMING OF READING IN OF INVERTER CIRCUIT ALARM

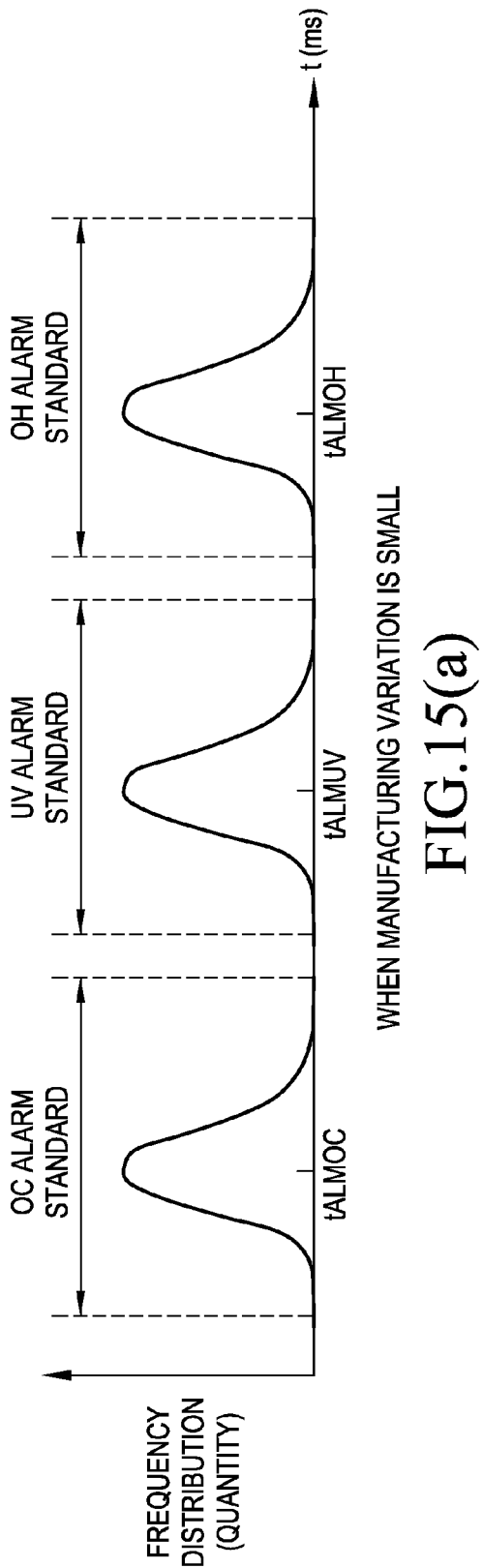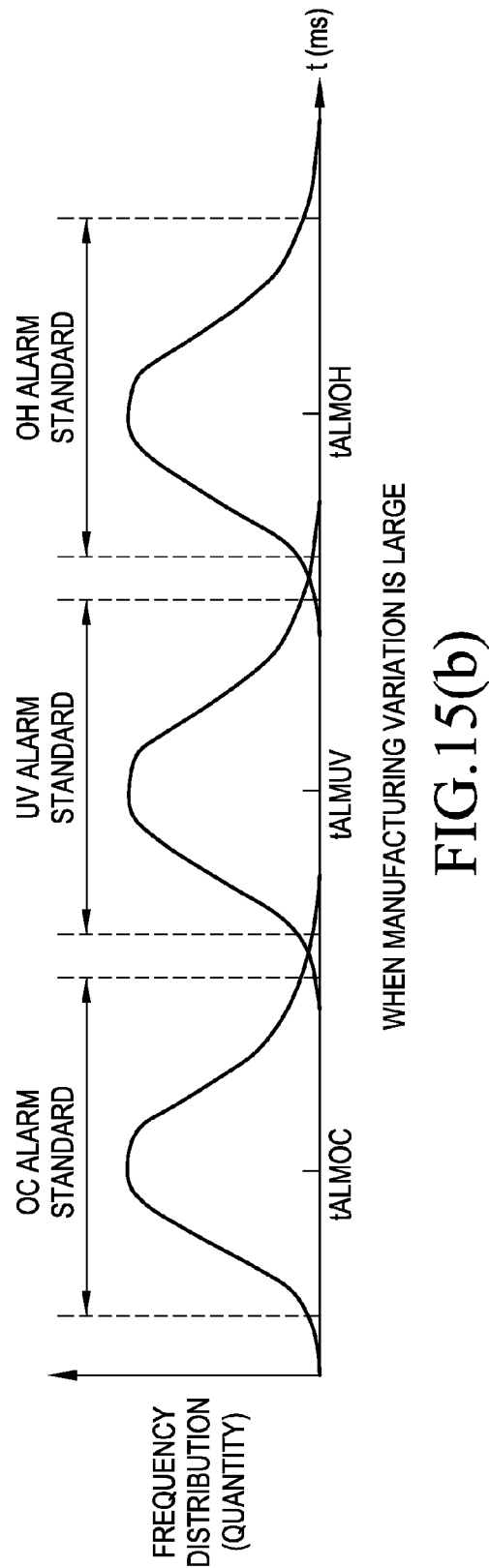

POWER CONVERSION DEVICE CONTROL DEVICE

CROSS-REFERENCE TO RELATED APPLICATIONS

This application is a continuation of International Application No. PCT/JP2012/002427, filed on Apr. 6, 2012, which is based on and claims priority to Japanese Patent Application No. JP PA 2011-086717, filed on Apr. 8, 2011. The disclosure of the Japanese priority application and the PCT application in their entirety, including the drawings, claims, and the specification thereof, are incorporated herein by reference.

BACKGROUND

1. Field of the Invention

Aspects of the invention relate to power conversion device control devices that drive semiconductor elements.

2. Related Art

As this kind of power conversion device control device, there is known, for example, a power transistor module failure determination method of individually determining failure causes by giving pulse widths of failure detection signals differing setting times in accordance with an overheat failure, an overcurrent failure, a short circuit failure, and an insufficient voltage failure detected in a power transistor module that drives an inverter. See, for example, Japanese patent publication no. JP-A-08-70580 (also referred to herein as "PTL 1").

Also, as another power conversion device control device, there is known a power module wherein, when decoding signals output by four protection circuits in a decoder and outputting a result thereof from three output terminals, decoding is carried out in such a way that a combination of the values of one or more detection signals is correlated to plural combinations of the protection circuit output signals in the decoder. See, for example, Japanese patent publication no. JP-A-10-267977 (also referred to herein as "PTL 2").

Furthermore, as another power conversion device control device, there is proposed an intelligent power module that includes a required number of semiconductor switching elements, a drive circuit, various kinds of detector circuit and warning circuit that detect a fatal error and precursory error of the switching elements, drive circuit, or the like, an error detector logic circuit that carries out a protection operation for the switching elements when an error is detected by the detector circuits and warning circuits, a control circuit for outputting a signal based on an error detection signal to the exterior, and a transmission circuit. See, for example, Japanese patent publication no. JP-A-2002-27665 (also referred to herein as "PTL 3").

In the heretofore known example described in PTL 3, an output terminal that outputs an alarm signal when a fatal error is detected, and an output terminal that outputs an error cause determination signal indicating causes of errors including fatal errors and precursory errors, are provided in the transmission circuit, and these are preferably used together as a single output terminal.

However, in the heretofore known example described in PTL 1, an overheat failure, overcurrent failure, short circuit failure, and insufficient voltage failure of the power transistor module are detected individually, pulse signals of differing pulse widths are supplied to an OR gate, and a collective failure detection signal is output from the OR gate. Because of this, even though an overheat failure, overcurrent failure, short circuit failure, and insufficient voltage failure are detected individually, and pulse signals of differing pulse widths are output, each pulse signal is passed through the OR gate and formed into a collective failure detection signal, meaning that when another error occurs in a condition in which plural errors are occurring simultaneously, or one error is occurring, there is an unsolved problem in that the pulse width of the error detection signal increases in length, and it is not possible to carry out a normal error detection.

Also, in the heretofore known example described in PTL 2, when decoding signals output by four protection circuits in the decoder and outputting a result thereof from three output terminals, a combination of the values of one or more detection signals is correlated to plural combinations of the protection circuit output signals in the decoder, and a protection operation condition is notified of with the number of output terminals less than the number of protection circuits. Because of this, it is possible to solve the unsolved problem of PTL 1, but there is an unsolved problem in that it is necessary to form plural output terminals, and the manufacturing cost soars.

Furthermore, in the heretofore known example described in PTL 3, when alarm signals or warning signals output from the various kinds of detector circuit and warning circuit that detect a fatal error and precursory error of the switching elements, drive circuit, or the like, are input into the control circuit, the signals are latched, the protection circuit operation to be carried out next is not accepted until the signal latch is released, and it is possible to prevent an erroneous detection. However, with PTL 3, when configuring, for example, a three-phase inverter with six identical driver ICs, there is an unsolved problem in that a transmission circuit that collects and processes signals from each driver IC is needed, and the manufacturing cost soars.

SUMMARY OF THE INVENTION

Therefore, aspects of the invention, having been contrived focusing on the unsolved problems of the heretofore known examples, can provide a power conversion device control device with which it is possible to accurately determine the protection operation condition of plural protection circuits, with a simple configuration and with no erroneous detection.

In some aspects of the invention, a power conversion device control device according to one aspect of the invention is characterized by including plural drive circuits including a semiconductor element drive circuit that drives one of plural semiconductor elements configuring a power conversion device based on a drive signal input from a control circuit, plural protection circuits that detect information necessary in order to carry out a protection operation of the semiconductor element, and an alarm signal formation circuit, in which there is set a pulse signal having as one cycle a period in which are combined a determination period, of which a different period is set for each of the plural protection circuits, and a constant period whose condition varies with respect to the determination period, in which a protection circuit among the plural protection circuits for which it is first detected that a protection operation is necessary is taken as a first-come first-served protection circuit, and in which the pulse signal corresponding to the protection circuit is output as an alarm signal to an alarm signal terminal. The alarm signal formation circuit is such that a resetting condition of the alarm signal is a condition that a protection operation stopped condition, wherein it is detected that no protection operation is necessary in at least the first-come first-served protection circuit, is met, and a determination of the resetting condition is carried out during the constant period of the pulse signal.

Also, a power conversion device control device according to another aspect of the invention is characterized in that the alarm signal formation circuit is such that a resetting condition of the alarm signal is a condition that a protection operation stopped condition, wherein it is detected that no protection operation is necessary in any of the protection circuits, is met, and a determination of the resetting condition is carried out during the constant period.

Also, a power conversion device control device according to another aspect of the invention is characterized in that the alarm signal formation circuit is such that a resetting condition of the alarm signal is a condition that a protection operation stopped condition, wherein it is detected that no protection operation is necessary in the first-come first-served protection circuit, and a drive stop condition of the drive signal, are met, and a determination of the resetting condition is carried out during the constant period.

Furthermore, a power conversion device control device according to another aspect of the invention is characterized in that the alarm signal formation circuit is such that a resetting condition of the alarm signal is a condition that a protection operation stopped condition, wherein it is detected that no protection operation is necessary in any of the protection circuits, and a drive stop condition of the input drive signal, are met, and a determination of the resetting condition is carried out during the constant period.

Also, a power conversion device control device according to another aspect of the invention is characterized in that the alarm signal formation circuit is configured in such a way that a protection operation flag is set between it being detected that a protection operation is necessary in the first-come first-served protection circuit and the resetting condition being met, an output signal to the semiconductor element of the driver circuit is stopped while the protection operation flag is set, and the alarm signal is output.

Also, a power conversion device control device according to another aspect of the invention is characterized in that each of the plural driver circuits is configured of a single IC chip, one alarm terminal is formed in the IC chip, and there is provided a function whereby voltage information of the alarm terminal is detected inside the IC chip, and it is determined, using the voltage information, whether or not to output the pulse signal corresponding to the first-come first-served protection circuit to the alarm signal terminal as an output alarm signal.

Also, a power conversion device control device according to another aspect of the invention is characterized in that the plural driver circuits is configured inside a single IC chip, and the alarm signal terminals of each driver circuit are mutually connected by wire and connected to one alarm terminal formed in the IC chip.

Also, a power conversion device control device according to another aspect of the invention is characterized in that all the driver circuits are configured inside a single IC chip, and the alarm signal terminals of each driver circuit are mutually connected by wire and connected to one alarm terminal formed in the IC chip.

Also, a power conversion device control device according to another aspect of the invention is characterized in that each driver circuit is connected via an isolated signal transmission unit to a control circuit that controls the power conversion device, an input drive signal is input from the control circuit via the isolated signal transmission unit, and an alarm signal is input via the isolated signal transmission unit into the control circuit.

Also, a power conversion device control device according to another aspect of the invention is characterized in that the control circuit, when an alarm signal is input via the isolated signal transmission unit, counts the number of pulses of the alarm signal and, when the counted value reaches a setting value, stops the output of the drive signal to the driver circuit.

Also, a power conversion device control device according to another aspect of the invention is characterized in that the control circuit, a pulse count setting value being set for each determination period of the alarm signal, measures the determination period of the alarm signal when the alarm signal is input via the isolated signal transmission unit, counts the number of pulses of the alarm signal and, when the counted number of pulses reaches the pulse count setting value of the determination period, stops the output of the drive signal to the driver circuit.

Also, a power conversion device control device according to one aspect of the invention is characterized by including plural drive circuits including a semiconductor element drive circuit that drives one of plural semiconductor elements configuring a power conversion device based on a drive signal input from a control circuit, plural protection circuits that detect information necessary in order to carry out a protection operation of the semiconductor element, and an alarm signal formation circuit, in which a reference pulse signal, having as one cycle a period in which are combined a first constant period and a second constant period whose condition varies with respect to the first constant period, is set for each of the plural protection circuits in such a way that a number of reference pulses emitted in a third constant period longer than the first and second constant periods differs, a protection circuit among the plural protection circuits for which it is first detected that a protection operation is necessary is taken as a first-come first-served protection circuit, and in which the pulse signal corresponding to the protection circuit is output as an alarm signal to an alarm signal terminal.

Also, a power conversion device control device according to another aspect of the invention is characterized in that the first period is set to a value greater than 1 ms.

Also, a power conversion device control device according to another aspect of the invention is characterized in that the second period is set to a value smaller than one tenth of that of the first period.

Also, a power conversion device control device according to another aspect of the invention is characterized in that a timing cycle at which the control circuit reads in the alarm signal is set to a value smaller than that of the second period.

Also, a power conversion device control device according to another aspect of the invention is characterized in that a timing cycle at which the control circuit reads in the alarm signal is set to a value half or less that of the second period.

Also, a power conversion device control device according to another aspect of the invention is characterized in that the semiconductor element is configured of a unidirectional MOS gate device, and a freewheel diode is connected in parallel to the unidirectional MOS gate device.

Also, a power conversion device control device according to another aspect of the invention is characterized in that the semiconductor element is configured of a bidirectional MOS gate device.

According to aspects of the invention, when plural protection circuits that detect information necessary in order to carry out a protection operation of a semiconductor element are provided in a power conversion device control device that individually drives semiconductor elements configuring a power conversion device, a protection circuit for which it is first detected that a protection operation is necessary is taken as a first-come first-served protection circuit, and a pulse signal with a cycle in which are combined a determination period corresponding to the protection circuit and a constant period is output as an alarm signal. A condition that a protection operation stopped condition, wherein it is detected that no protection operation is necessary in at least the first-come first-served protection circuit, is met is taken as a resetting condition of the alarm signal, and a determination of the resetting condition is carried out during the constant period of the pulse signal. Because of this, an advantage is obtained in that it is possible to reliably prevent the alarm signal from being affected by a protection circuit for which it is subsequently detected that a protection operation is necessary, and it is possible to reliably prevent the alarm signal from finishing partway through a determination period of the pulse signal configuring the alarm signal, thus enabling the formation of an accurate alarm signal.

BRIEF DESCRIPTION OF THE DRAWINGS

FIGS. 13(a)-13(c) are wave form diagrams showing a cycle of reading alarm signals into a control circuit;

FIGS. 15(a)-15(b) are illustrations accompanying a description of manufacturing variations.

DETAILED DESCRIPTION

Hereafter, a description will be given, based on the drawings, of embodiments of the invention.

Figure 1:
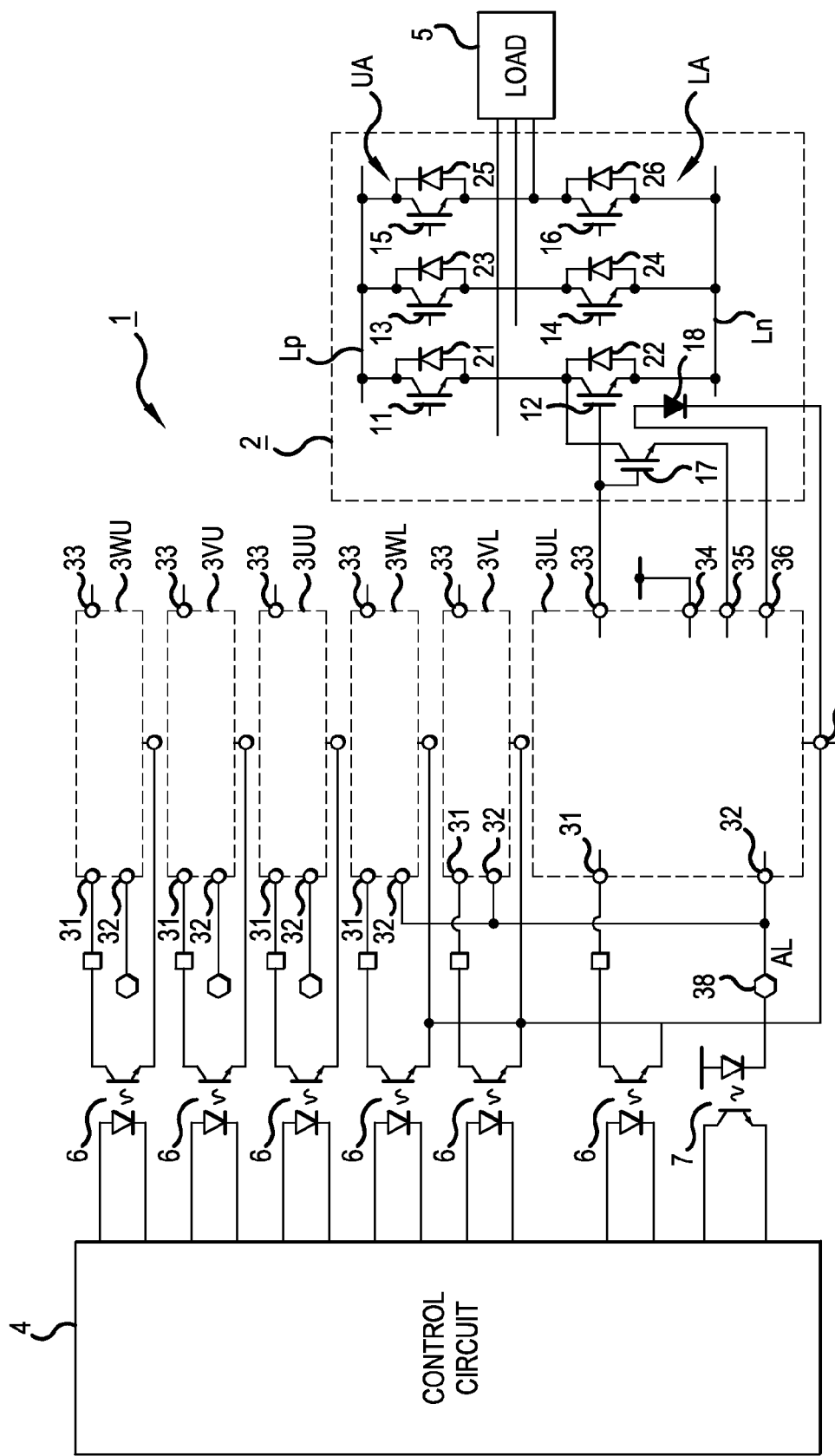
FIG. 1 is a block diagram showing a first embodiment of a power conversion device control device according to the invention.

FIG. 1 is a block diagram showing an embodiment in a case in which the invention is applied to a power conversion device. In FIG. 1, a power conversion device 1 includes an inverter 2 that converts direct current power to alternating current power, phase driver ICs 3UL to 3WL that individually drive semiconductor elements of a lower arm LA configuring the inverter 2, phase driver ICs 3UU to 3WU that individually drive semiconductor elements of an upper arm UA configuring the inverter 2, and a control circuit 4 that supplies drive signals to the phase driver ICs 3UL to 3WL and 3UU to 3WU.

The inverter 2 has six IGBTs (Insulated Gate Bipolar Transistors) 11 to 16 acting as semiconductor elements. The IGBTs 11 to 16 are such that a series circuit of the IGBTs 11 and 12, a series circuit of the IGBTs 13 and 14, and a series circuit of the IGBTs 15 and 16 are connected in parallel between a positive terminal side line Lp and a negative terminal side line Ln, which are connected to a direct current power supply and to which direct current power is supplied. Herein, flywheel diodes 21 to 26 are connected in reverse parallel to the IGBTs 11 to 16 respectively.

Also, the upper arm UA is configured by the IGBTs 11, 13, and 15, being a U-phase, V-phase, and W-phase IGBT respectively, while the lower arm LA is configured by the IGBTs 12, 14, and 16, being an X-phase, Y-phase, and W-phase IGBT respectively. Furthermore, a three-phase alternating current power is output from a connection point of the IGBTs 11 and 12, a connection point of the IGBTs 13 and 14, and a connection point of the IGBTs 15 and 16, and the three-phase alternating current power is supplied to an alternating current load 5, such as an electric motor.

Further, a current sensing IGBT 17 that detects a current flowing between the collector and the emitter of the IGBTs 11 to 16, and a temperature detecting diode 18 embedded in the same chip as the IGBTs 11 to 16, are provided in each of the IGBTs 11 to 16 configuring the inverter 2, as shown representatively by the IGBT 12. Herein, the collector and gate of the current sensing IGBT 17 are connected to the IGBT 12 collector and gate respectively.

Each of the driver ICs 3UL to 3WL, having the same configuration, has the configuration representatively shown by the driver IC 3UL that drives the IGBT 12 configuring the lower arm LA of the inverter 2. The driver IC 3UL includes an input terminal 31 into which a pulse width modulation signal acting as a gate drive signal is input from the external control circuit 4 via a photocoupler 6, an alarm signal terminal 32 that outputs an alarm signal to the external control circuit 4 via a photocoupler 7, and an output terminal 33 that outputs a gate drive signal to the gate of the IGBT 12 of the inverter 2. Also, the driver IC 3UL includes a voltage input terminal 34 into which a driver power supply voltage is input, a current input terminal 35 connected to the collector of the current sensing IGBT 17 of the inverter 2, an overheat detection sensor 36 connected to the anode of the temperature detecting diode 18 of the inverter 2, and a power ground terminal 37 connected to the cathode of the temperature detecting diode 18.

The pulse width modulation signal input into the input terminal 31 is temporarily input into an alarm signal formation circuit 41 after a signal processing such as a waveform rectification is carried out in an input circuit 40. A gate drive signal based on the pulse width modulation signal input into the alarm signal formation circuit 41 is output from the alarm signal formation circuit 41. The gate drive signal is amplified in an amplifier 42, and output as a gate drive signal to the gate drive signal output terminal 33.

The alarm signal formation circuit 41 is connected to the alarm signal terminal 32, and an alarm signal AL is output from the alarm signal formation circuit 41 to the alarm signal terminal 32.

Meanwhile, a low voltage protection circuit 51, which detects a low voltage condition wherein the driver IC power supply supplied to each of the drivers IC 3UL to 3WL drops to or below a predetermined voltage, is connected to the voltage input terminal 34. In the low voltage protection circuit 51, a high level protection operation signal H1 is output when the power supply voltage of the driver IC power supply drops to or below a low voltage threshold value.

Also, an overcurrent protection circuit 52 into which the current flowing through the current sensing IGBT 17 is input, and which detects an overcurrent condition, is connected to the current input terminal 35. In the overcurrent protection circuit 52, a high level protection operation signal H2 is output when it is detected that the current flowing through the current sensing IGBT 17 is in an overcurrent condition of an overcurrent threshold value or higher.

Furthermore, an overheat protection circuit 53 into which the inter-terminal voltage of the temperature detecting diode 18 is input, and which detects an intra-chip temperature, is connected to the overheat detection sensor 36. In the overheat protection circuit 53, the chip temperature is detected based on the inter-terminal voltage of the temperature detecting diode 18, and a high level protection operation signal H3 is output when the detected chip temperature is equal to or higher than a predetermined overheat threshold value.

Figure 2:
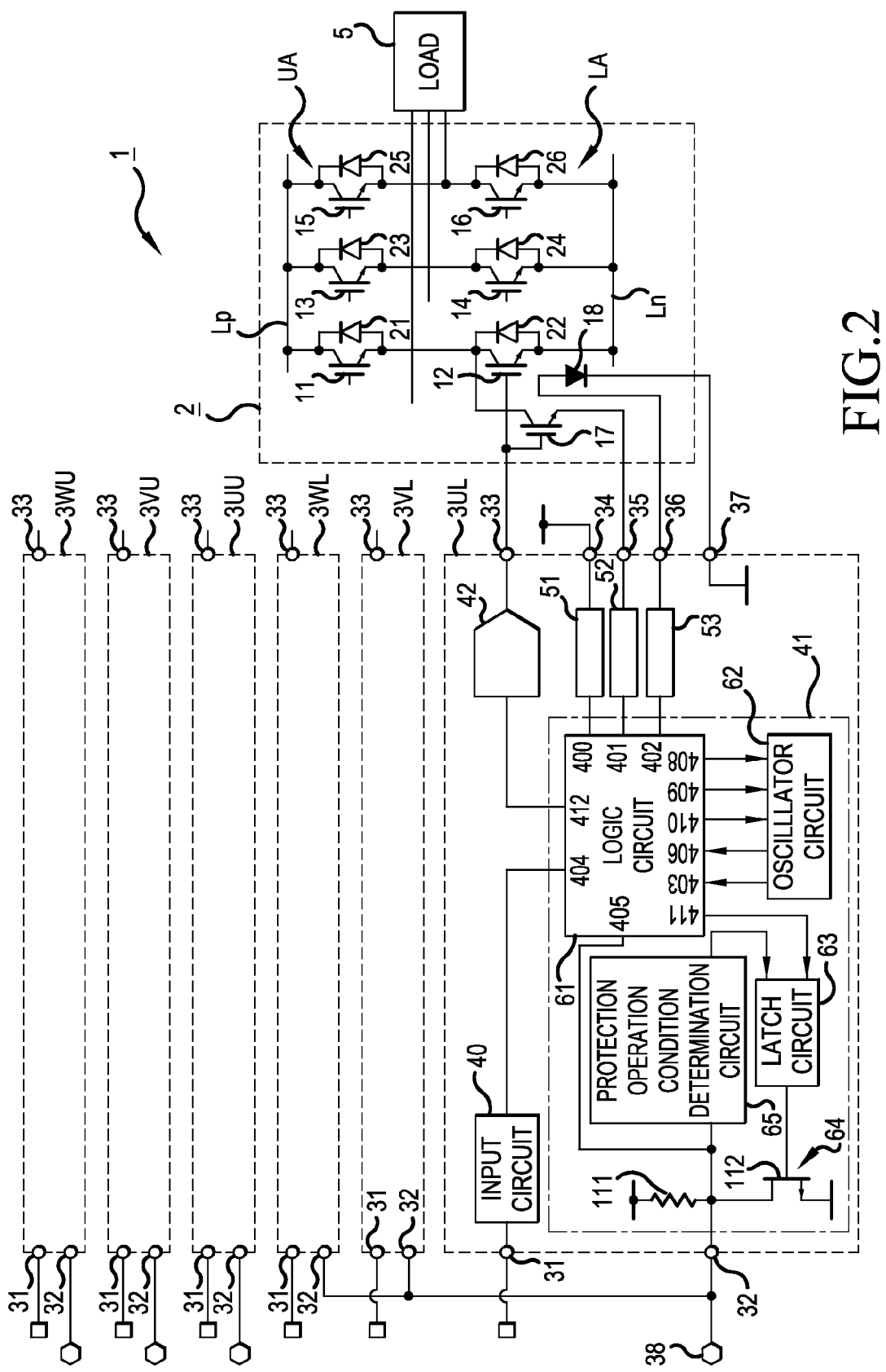
FIG. 2 is a block diagram showing an internal configuration of a driver IC of FIG. 1.

The alarm signal formation circuit 41 includes a logic circuit 61, an oscillator circuit 62, a latch circuit 63, an alarm signal formation unit 64, and a protection operation condition determination circuit 65, as shown in FIG. 2.

The logic circuit 61 includes protection operation signal input terminals 400 to 402 into which the protection operation signal H1 output from the low voltage protection circuit 51, the protection operation signal H2 output from the overcurrent protection circuit 52, and the protection operation signal H3 output from the overheat protection circuit 53 are individually input. Also, the logic circuit 61 includes an input terminal 403 into which is input a determination period termination signal DTS input from the oscillator circuit 62, to be described hereafter, an input terminal 406 into which is input a reset determination period signal RDS, also input from the oscillator circuit 62, a drive signal input terminal 404 into which is input a drive signal DS from the input circuit 40, and an alarm signal input terminal 405 into which is input the alarm signal AL.

Furthermore, the logic circuit 61 includes output terminals 408 to 410 that output protection operation start signals HA1 to HA3 to the oscillator circuit 62 in response to the protection operation signals H1 to H3, an output terminal 411 that outputs an alarm base signal ALB, which becomes an alarm signal, to the latch circuit 63, and an output terminal 412 that outputs a gate drive signal based on the input drive signal.

Figure 3:
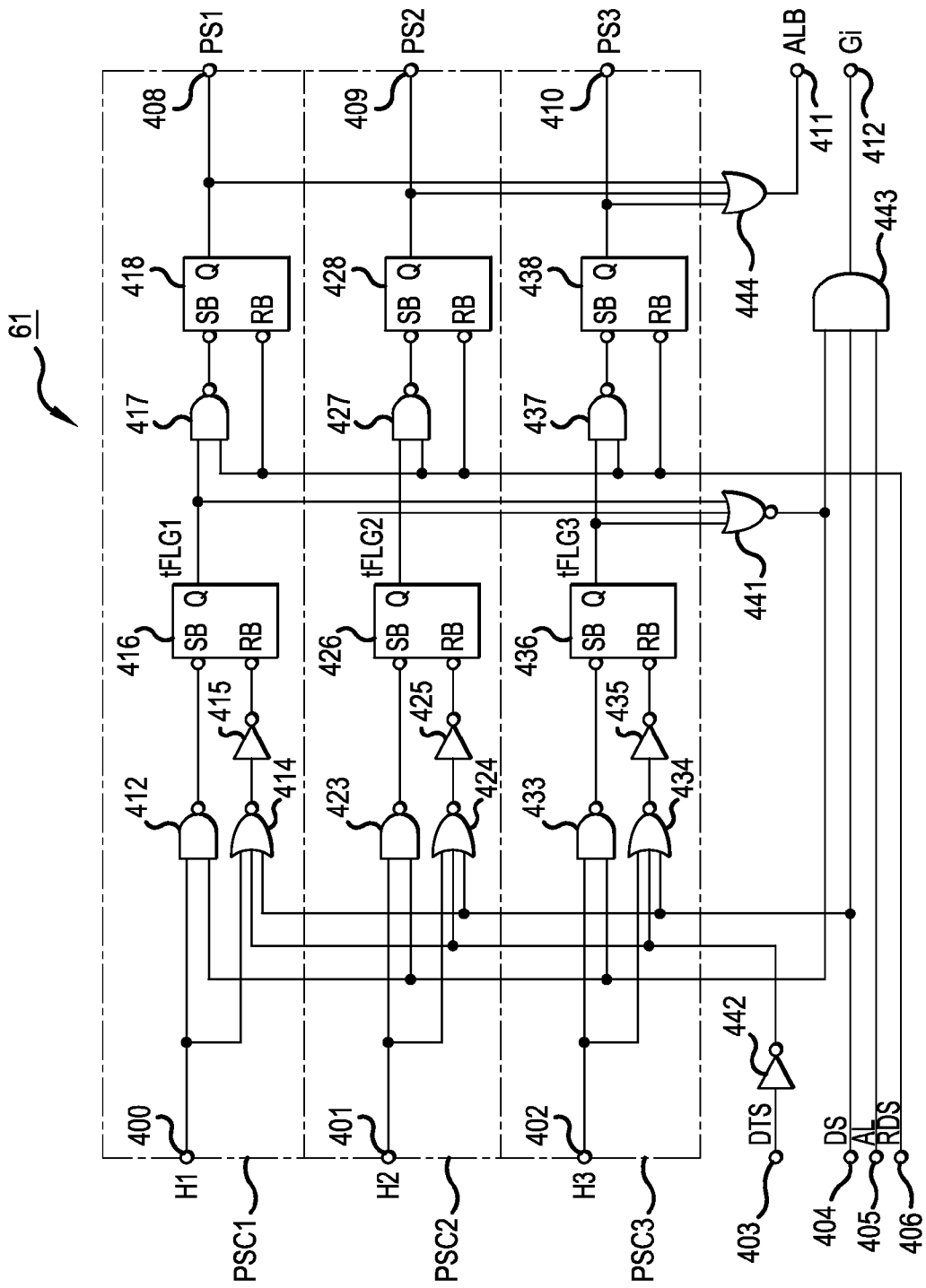
FIG. 3 is a block diagram showing a specific configuration of a logic circuit of FIG. 2.

A specific configuration of the logic circuit 61 is configured as shown in FIG. 3. That is, the logic circuit 61 includes a pulse signal formation circuit PSC1 that forms a pulse signal wherein a determination period and a constant period are combined based on the protection operation signal H1 input from the low voltage protection circuit 51.

The pulse signal formation circuit PSC1 has a NAND gate 413 of which one input terminal is connected to the input terminal 400 into which the protection operation signal H1 is input, and to the other input terminal of which the output side of a NOR 441, to be described hereafter, is connected. Also, the pulse signal formation circuit PSC1 has a NOR gate 414 into which is input the protection operation signal H1, the drive signal DS input from the input circuit 40, and a signal wherein the determination period termination signal DTS input from the oscillator circuit 62 is inverted in a NOT circuit 442.

Further, the output of the NAND gate 413 is input into an inverting set terminal SB of an RS type flip-flop circuit 416, and the output of the NOR gate 414 is input into an inverting reset terminal RB of the RS type flip-flop circuit 416 via a NOT circuit 415.

A protection operation condition signal tFLG, acting as a protection operation flag, output from an output terminal Q of the RS type flip-flop circuit 416 is supplied to an input side of a NAND gate 417. A reset determination period signal RDS output from the oscillator circuit 62, to be described hereafter, is supplied to the other input side of the NAND gate 417.

The output of the NAND gate 417 is input into an inverting set terminal SB of an RS type flip-flop circuit 418. The reset determination period signal RDS output from the oscillator circuit 62 is input into an inverting reset terminal RB of the RS type flip-flop circuit 418.

A pulse signal PS1, which forms an alarm base signal, is output to the output terminal 408 from an output terminal Q of the RS type flip-flop circuit 418, and supplied to the oscillator circuit 62 via the output terminal 408.

Also, the logic circuit 61 includes a pulse signal formation circuit PSC2 into which is input the protection operation signal H2 output from the overcurrent protection circuit 52. The pulse signal formation circuit PSC2 has the same configuration as the pulse signal formation circuit PSC1. Consequently, in the pulse signal formation circuit PSC2, portions corresponding to the pulse signal formation circuit PSC1 are given reference numerals wherein ten is added to the corresponding reference numerals in the pulse signal formation circuit PSC1, and a detailed description thereof is omitted. A pulse signal PS2 is output from the output terminal Q of the RS type flip-flop circuit 428.

Furthermore, the logic circuit 61 includes a pulse signal formation circuit PSC3 into which is input the protection operation signal H3 output from the overheat protection circuit 53. The pulse signal formation circuit PSC3 also has the same configuration as the pulse signal formation circuit PSC1. Consequently, in the pulse signal formation circuit PSC3, portions corresponding to the pulse signal formation circuit PSC1 are given reference numerals wherein twenty is added to the corresponding reference numerals in the pulse signal formation circuit PSC1, and a detailed description thereof is omitted. A pulse signal PS3 is output from the output terminal Q of the RS type flip-flop circuit 438.

Also, the logic circuit 61 has the NOR gate 441 into which are input the protection operation condition signals tFLG output from the output terminals Q of the RS type flip-flop circuits 416, 426, and 436 of the pulse signal formation circuits PSC1 to PSC3. The output signal of the NOR gate 441 is input into the other input side of the NAND gates 413, 423, and 433 of the pulse signal formation circuits PSC1 to PSC3.

Also, the logic circuit 61 has an OR gate 444 into which are input the pulse signals PS1, PS2, and PS3 output from the output terminals Q of the RS type flip-flop circuits 418, 428, and 438 of the pulse signal formation circuits PSC1 to PSC3. The alarm base signal ALB output from the OR gate 444 is output to the latch circuit 63 via the output terminal 411.

Furthermore, the logic circuit 61 has an AND gate 443 into which are input the drive signal DS from the input circuit 40 input into the input terminal 404, the alarm signal AL input into the input terminal 405, and the output signal of the NOR gate 441. The output signal of the AND gate 443 is input via the output terminal 412 into the amplifier 42 as a gate drive signal GDS.

Herein, a drive circuit is configured of the input circuit 40, the AND gate 443 of the logic circuit 61, and the amplifier 42.

Figure 4:
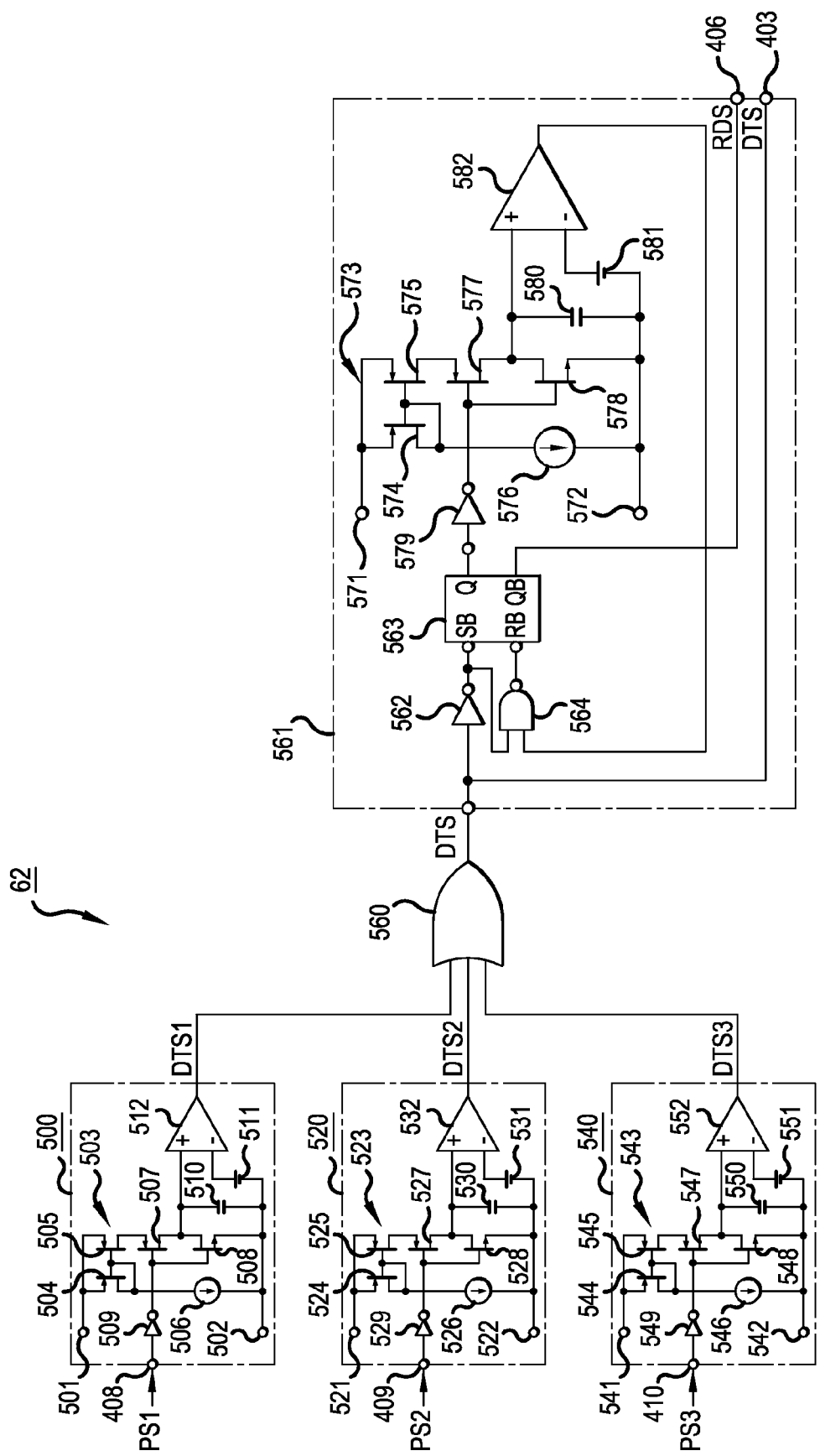
FIG. 4 is a block diagram showing a specific configuration of an oscillator circuit of FIG. 2.

Also, the oscillator circuit 62, as shown in FIG. 4, includes determination period signal formation circuits 500, 520, and 540, into which the pulse signals PS1, PS2, and PS3 output from the output terminals 408, 409, and 410 of the logic circuit 61 are individually input, that form output signals with differing determination periods Ta for each of the pulse signals PS1, PS2, and PS3.

Also, the oscillator circuit 62 has a constant period signal formation circuit 561, to which the output signals of the determination period signal formation circuits 500, 520, and 540 are supplied via an OR gate 560, that forms a constant period Tb.

The determination period signal formation circuit 500, as shown in FIG. 4, is such that a current mirror circuit 503 is connected between a positive terminal side power supply terminal 501 and a negative terminal side power supply terminal 502. The current mirror circuit 503 has two PMOS-FETs 504 and 505, whose sources are connected to the positive terminal side power supply terminal 501 and whose gates are connected to each other. Also, the current mirror circuit 503 includes a constant current supply 506 inserted between the PMOS-FET 504 and negative terminal side power supply terminal 502 and a PMOS-FET 507 and NMOS-FET 508 inserted in series between the PMOS-FET 505 and negative terminal side power supply terminal 502. Herein, the gates of the PMOS-FETs 504 and 505 are connected to the drain of the PMOS-FET 504.

Further, the gates of the PMOS-FET 507 and NMOS-FET 508 are connected via a NOT circuit 509 to the input terminal 408, to which the pulse signals PS1 to PS3 output from the logic circuit 61 are supplied.

Also, a charge and discharge capacitor 510 is connected in parallel between the source and drain of the NMOS-FET 508. A point between the charge and discharge capacitor 510 and a connection point of the PMOS-FET 507 and NMOS-FET 508 is connected to a non-inverting input side of a comparator 512. A reference voltage supply 511 set at a voltage Vref1 considerably lower than the IC power supply voltage is connected to an inverting input side of the comparator 512.

Figure 5A:
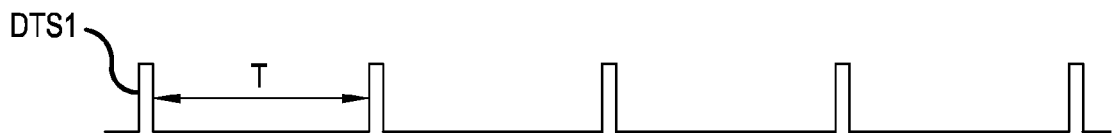
FIGS. 5(a)-5(c) are signal wave form diagrams showing a determination period termination signal.

Because of this, a determination period termination signal DTS1 shown in FIG. 5(a), which is at a high level when the non-inverting input side voltage exceeds the reference voltage Vref1 of the reference voltage supply 511, at a low level when, conversely, the non-inverting input side voltage is lower than the reference voltage Vref1 of the reference voltage supply 511, and continues at a low level throughout a comparatively short protection signal determination period T corresponding to the low voltage protection circuit 51, is output from the comparator 512.

Figure 5B:
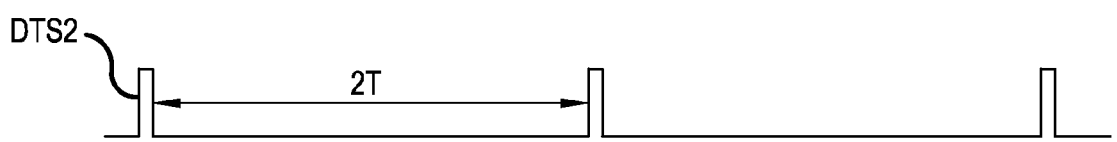

Also, as the determination period signal formation circuit 520 has the same circuit configuration as the determination period signal formation circuit 500, portions corresponding to the determination period signal formation circuit 500 are given reference numerals wherein twenty is added to the corresponding reference numerals in the determination period signal formation circuit 500, and a detailed description thereof is omitted. In the determination period signal formation circuit 520, however, a reference voltage Vref2 of the reference voltage supply 531 is set twice as high as the reference voltage Vref1 of the reference voltage supply 511. Consequently, as shown in FIG. 5(b), there is output a determination period termination signal DTS2, which is at a low level for a period 2T which is, for example, twice as long as that of the determination period termination signal DTS1.

Figure 5C:
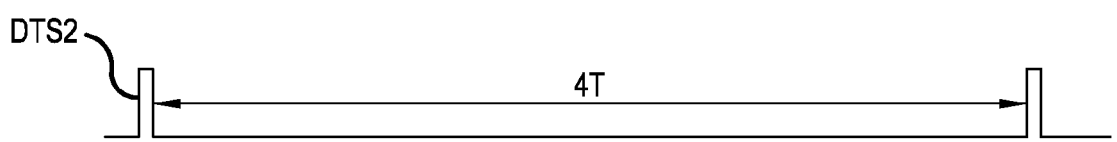

In the same way, as the determination period signal formation circuit 540 also has the same circuit configuration as the determination period signal formation circuit 500, portions corresponding to the determination period signal formation circuit 500 are given reference numerals wherein forty is added to the corresponding reference numerals in the determination period signal formation circuit 500, and a detailed description thereof is omitted. In the determination period signal formation circuit 540 too, however, a reference voltage Vref3 of the reference voltage supply 551 is set at a voltage higher than the reference voltage Vref2 of the reference voltage supply 531 and twice as high as the IC power supply voltage. Consequently, as shown in FIG. 5(c), there is output a determination period termination signal DTS3, which is at a low level for a period 4T which is, for example, four times as long as that of the determination period termination signal DTS1.

The constant period signal formation circuit 561 includes an RS type flip-flop circuit 563 into whose inverting set terminal SB the determination period termination signal DTS output from the OR gate 560 is input via a NOT circuit 562. The output of a NAND gate 564, into which are input the output of the NOT circuit 562 and the output of a comparator 582, to be described hereafter, is input into an inverting reset terminal RB of the RS type flip-flop circuit 563.

The output of an output terminal Q of the RS type flip-flop circuit 563 is input into a time delay circuit 570. The time delay circuit 570 has the same configuration as the determination period signal formation circuit 500. Consequently, members the same as in the determination period signal formation circuit 500 are given reference numerals wherein seventy is added to the corresponding reference numerals in the determination period signal formation circuit 500, and a detailed description thereof is omitted.

In the time delay circuit 570, the capacitance of a charge and discharge capacitor 580 is set to be a small capacitance in comparison with the capacitance of the charge and discharge capacitor 510, and a configuration is such as to form the constant period Tb. Further, the comparison output of the comparator 582 is supplied to the other input side of the NAND gate 564.

Also, the oscillator circuit 62 is such that the determination period termination signal DTS output from the OR gate 560 is input into the input terminal 403 of the logic circuit 61, and the reset determination period signal RDS output from an inverting output terminal QB of the RS type flip-flop circuit 563 is input into the input terminal 406 of the logic circuit 61.

Figure 6:
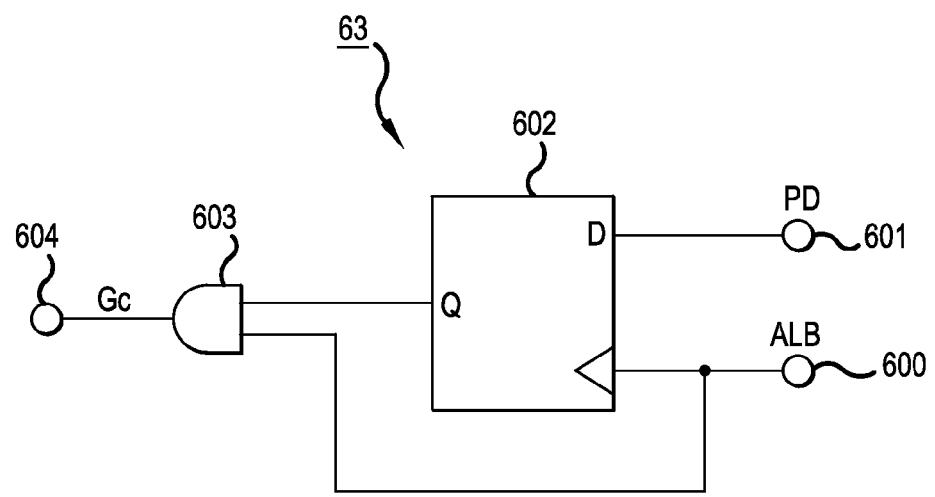
FIG. 6 is a block diagram showing a specific configuration of a latch circuit of FIG. 2.

Also, the latch circuit 63, as shown in FIG. 6, includes an input terminal 600 into which is input the alarm base signal ALB output from the output terminal 411 of the logic circuit 61, and an input terminal 601 into which is input a protection operation condition determination signal PD output from the protection operation condition determination circuit 65, to be described hereafter.

Further, the input terminal 600 is connected directly to a clock input terminal CL of a D type flip-flop circuit 602, and the input terminal 601 is connected to a data input terminal D of the D type flip-flop circuit 602. Also, an output terminal Q of the D type flip-flop circuit 602 and the input terminal 600 are connected to an input side of an AND gate 603. The logical product output of the AND gate 603 is output to the alarm signal formation unit 604 as a gate control signal Gc.

Also, the alarm signal formation unit 64, as shown in FIG. 2, has a configuration wherein a series circuit of a pull-up resistor 111 and an NMOS-FET 112 acting as a switching element is connected between a power supply terminal and the ground.

Further, the gate control signal Gc output from the latch circuit 63 is input into the gate of the NMOS-FET 112. Also, a connection point of the pull-up resistor 111 and NMOS-FET 112 is connected to the alarm signal terminal 32, and is also connected to the input terminal 405 of the logic circuit 61 and the protection operation condition determination circuit 65.

Figure 7:
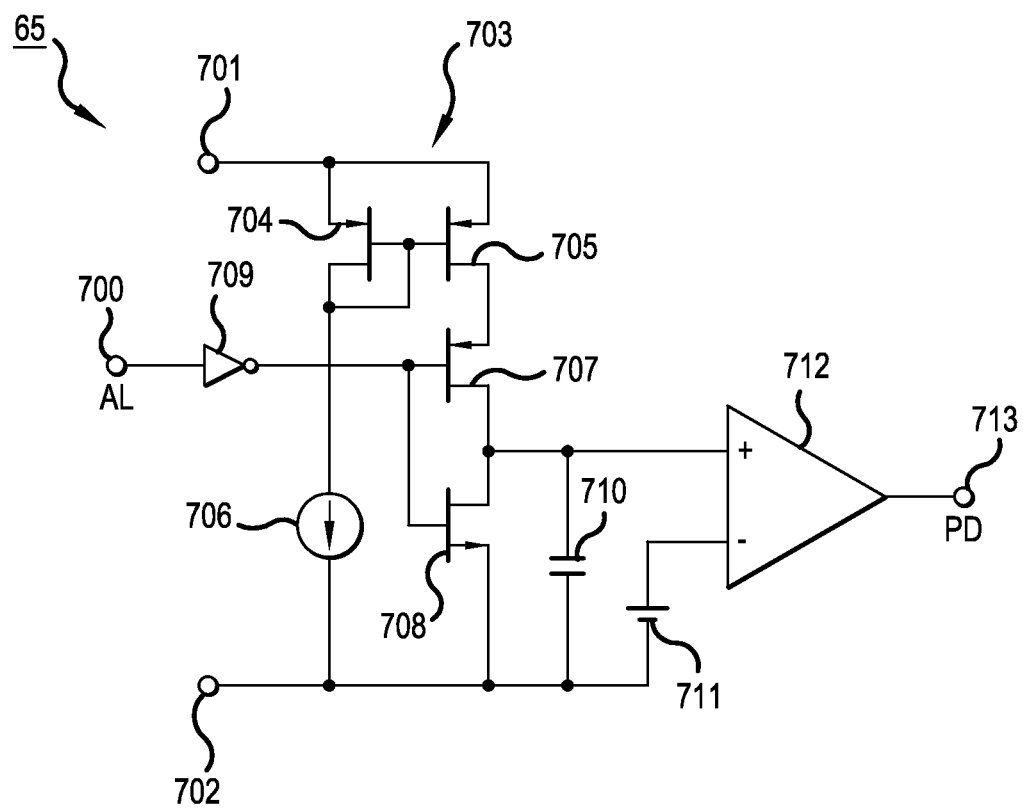
FIG. 7 is a block diagram showing a specific configuration of a protection operation condition determination circuit of FIG. 2.

The protection operation condition determination circuit 65, as shown in FIG. 7, has the same configuration as the determination period signal formation circuit 500. Consequently, portions corresponding to the determination period signal formation circuit 500 are given reference numerals wherein two hundred is added to the corresponding reference numerals in the determination period signal formation circuit 500, and a detailed description thereof is omitted. In the protection operation condition determination circuit 65 too, the protection operation condition determination signal PD, wherein a high level leading edge of the alarm signal AL input into an input terminal 700 is delayed by a delay time TD in accordance with the capacitance of a charge and discharge capacitor 710, is output to the input terminal 601 of the latch circuit 63.

Further, at least the driver ICs 3UL to 3WL corresponding to the lower arm LA of the inverter 2 are configured inside one IC chip. One alarm signal output terminal 38 is configured by the alarm signal terminals 32 of each driver IC 3UL to 3WL being connected to each other. The alarm signal output terminal 38 is connected to the control circuit 4 via the photocoupler 7.

Also, the control circuit 4 outputs individual drive signals DS, which drive the gates of the IGBTs 11 to 16 of the inverter 2, to the driver ICs 3UL to 3WL and 3UU to 3WU via individual photocouplers 6.

Also, the control circuit 4 reads in the alarm signal AL, identifies, based on the determination period Ta, which of the protection circuits 51 to 53 is the protection circuit that is in a protection operation condition, counts a number N1 to N3 of the constant period Tb in accordance with the identified circuit of the protection circuits 51 to 53, and stops the output of the drive signal DS when the number N1 to N3 reaches a preset number Ns1 to Ns3. Furthermore, when the input of the alarm signal AL is stopped with the output of the drive signal DS in a stopped condition, the control circuit 4 restores the condition wherein the drive signal DS is output.

Next, a description will be given of an operation of the first embodiment.

Now, it is assumed that the current flowing through the IGBTs 11 to 16 configuring the inverter 2 is below the overcurrent threshold value and normal, that the temperature in the chip in which the IGBTs 11 to 16 are formed is below the overheat threshold value and normal, and furthermore, that the IC power supply voltage supplied to the driver ICs 3UL to 3WL and 3UU to 3WU exceeds the low voltage threshold value and is normal.

In this normal condition, the protection operation signals H1, H2, and H3 output from the low voltage protection circuit 51, overcurrent protection circuit 52, and overheat protection circuit 53 of the driver ICs 3UL to 3WL and 3UU to 3WU are at a low level. At this time, when all of the RS type flip-flop circuits 416, 426, and 436 and 418, 428, and 438 are in a reset condition in the logic circuit 61, the output of the NOR gate 441 is at a high level. The high level output of the NOR gate 441 is supplied to the NAND gates 413, 423, and 433.

Figure 8:
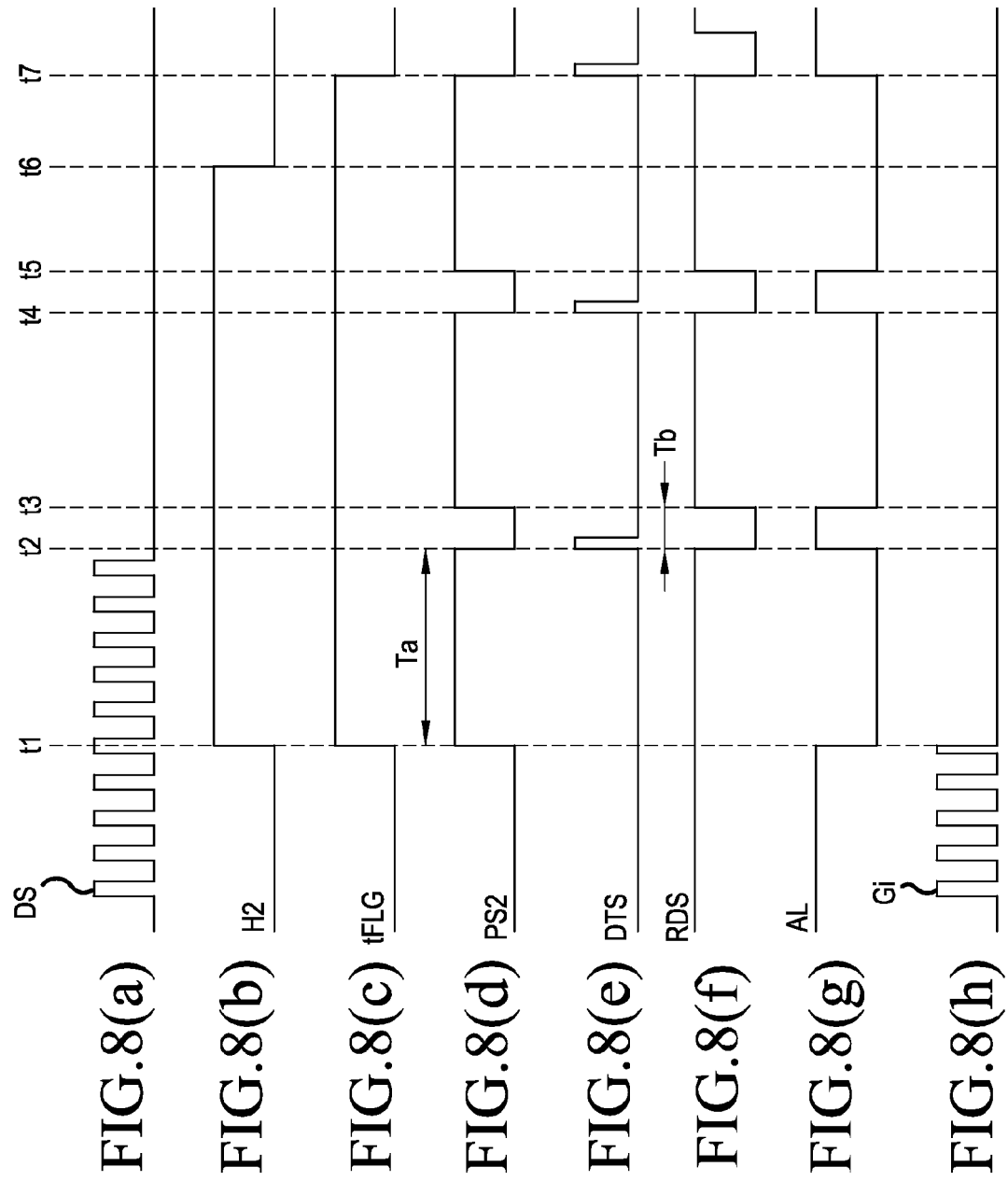
FIGS. 8(a)-8(h) are signal wave form diagrams accompanying a description of operations of the first embodiment.

Also, the pulse signals PS1 to PS3 output from the output terminals Q of the RS type flip-flop circuits 418, 428, and 438 are at a low level, as shown in FIG. 8(d). Because of this, the alarm base signal ALB output from the OR gate 444 is at a low level.

As the alarm base signal ALB is output to the latch circuit 63, the gate control signal Gc output from the AND gate 603 is at a low level. Consequently, the NMOS-FET 112 of the alarm signal formation unit 64 is in an off condition, and the alarm signal AL is at a high level, indicating a normal condition.

In response to this, in the protection operation condition determination circuit 65, as the alarm signal AL is at a high level, the PMOS-FET 707 is in an on condition, the NMOS-FET 708 is in an off condition, and the charge and discharge capacitor 710 is in a charging condition. Because of this, the protection operation condition determination signal PD output from the comparator 712 is at a high level.

Also, in the oscillator circuit 62, as the input pulse signals PS1 to PS3 are at a low level, the determination period termination signals DTS1 to DTS3 of the determination period signal formation circuits 500, 520, and 540 maintain a low level. Because of this, the determination period termination signal DTS output from the OR gate 560 also maintains a low level, as shown in FIG. 8(e).

Because of this, the RS type flip-flop circuit 563 is in a reset condition, the output signal of the output terminal Q thereof is at a low level, and the reset determination period signal RDS output from the inverting output terminal QB maintains a high level, as shown in FIG. 8(f).

In this normal condition, the output signal of the NOR gate 441 of the logic circuit 61 is at a high level, the alarm signal AL is also at a high level, and these are supplied to the AND gate 443. Furthermore, the drive signal DS formed from a pulse width modulation signal shown in FIG. 8(a) from the control circuit 4, input from the input circuit 40, is input into the AND gate 443. Because of this, a gate drive signal Gi in accordance with the drive signal DS from the AND gate 443 is amplified by the amplifier 42, and output to the output terminal 33. The gate drive signal Gi is supplied to the gate of the IGBT 12 of the inverter 2.

In the same way, gate drive signals are also output from the other driver ICs 3VL, 3WL, and 3UU to 3WU to the corresponding IGBTs of the inverter 2. Because of this, direct current power is converted to alternating current power in the inverter 2, thus driving the alternating current load 5.

From this normal condition, it is assumed that one of a low voltage condition, overcurrent condition, or overheat condition, necessitating a protection operation in one of the protection circuits 51 to 53, is detected at a point t1, and one of the protection operation signals H1 to H3, for example, the protection operation signal H2, changes to a high level, as shown in FIG. 8(b).

In this case, as the protection operation signal H2 changes to a high level, the output of the NAND gate 423 of the logic circuit 61 changes to a low level, in response to which the RS type flip-flop circuit 426 is set. Because of this, a protection operation condition signal tFLG2, which is a protection operation flag output from the output terminal Q of the RS type flip-flop circuit 426, changes to a high level.

At this time, the output of the NOR gate 441 changes from a high level to a low level, and this is supplied to the input side of the NAND gates 413, 423, and 433. Because of this, the outputs of the NAND gates 413, 423, and 433 are prevented from changing to a low level. Consequently, even when another protection operation signal H1 or H3 changes to a high level in a condition in which the protection operation signal H2 maintains a high level, it is possible to reliably prevent the RS type flip-flop circuit 416 or 436 from being set.

Further, when the RS type flip-flop circuit 426 is in a set condition, the protection operation condition signal tFLG acting as a protection operation flag changes to a high level, as shown in FIG. 8(c). Before the protection operation condition signal tFLG acting as a protection operation flag rises, the reset determination period signal RDS of the oscillator circuit 62 maintains a high level, as shown in FIG. 8(f). As the reset determination period signal RDS is supplied to the NAND gate 427 of the logic circuit 61, the output signal of the NAND gate 427 changes to a low level, and the RS type flip-flop circuit 428 is set.

Because of this, the pulse signal PS2 output from the output terminal Q of the RS type flip-flop circuit 428 changes to a high level, as shown in FIG. 8(d). At the same time as this, the alarm base signal ALB output from the OR gate 444 also changes to a high level, as shown in FIG. 9(a), and the alarm base signal ALB is supplied to the clock terminal of the D type flip-flop circuit 602 of the latch circuit 63.

Figure 9:
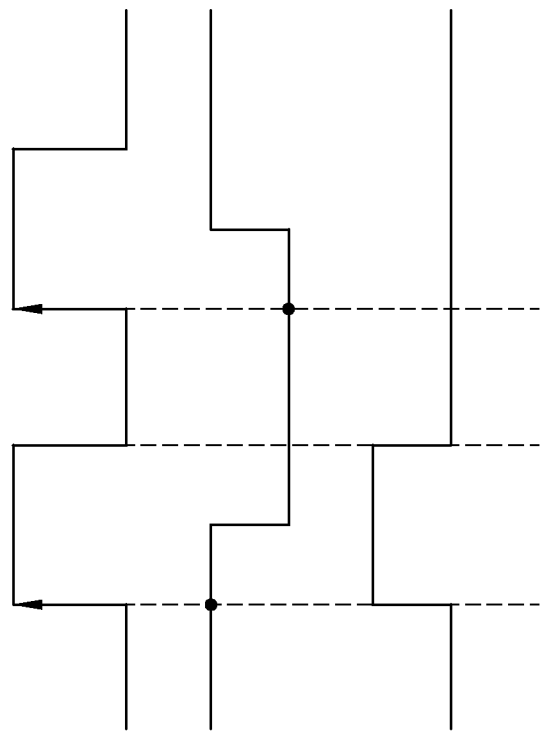
FIG. 9(a)-9(c) are signal wave form diagrams of the latch circuit.

At this time, as previously described, the protection operation condition determination signal PD output from the protection operation condition determination circuit 65 is at a high level, as shown in FIG. 9(b), meaning that a high level output signal from the output terminal Q of the D type flip-flop circuit 602 is output to the AND gate 603. Because of this, the gate control signal Gc output from the AND gate 603 changes to a high level, as shown in FIG. 9(c).

The gate control signal Gc is supplied to the NMOS-FET 112 of the alarm signal formation unit 64, and the NMOS-FET is put into an on condition. Consequently, the alarm signal AL changes to a low level, indicating a protection operation condition, as shown in FIG. 8(g).

Meanwhile, in the oscillator circuit 62, the PMOS-FET 527 is put into an on condition, and the NMOS-FET 528 put into an off condition, by the pulse signal PS2 changing to a high level, and the charge and discharge capacitor 530 starts charging.

Subsequently, when a charging voltage Vc of the charge and discharge capacitor 530 reaches or exceeds the reference voltage Vref2 of the reference voltage supply 531 at a point t2, the determination period termination signal DTS2 output from the comparator 532 changes to a high level. Because of this, the determination period termination signal DTS output from the OR gate 560 inverts to a high level, as shown in FIG. 8(e). The determination period termination signal DTS becomes an input of the NOR gate 424 via the NOT circuit 442.

As the RS type flip-flop circuit 426 is reset when the inverted signals DS, H2, and DTS, which are the three terminal inputs of the NOR gate 424, are all at a low level, the output terminal Q of the RS type flip-flop circuit 426 changes to a low level, and the protection operation condition is terminated. When even one of the inverted signals DS, H2, and DTS, which are the three terminal inputs of the NOR gate 424, is at a high level, the output terminal Q of the RS type flip-flop circuit 426 maintains a high level, and the protection operation condition is continued.

Also, when the identification period termination signal DTS changes to a high level, the RS type flip-flop circuit 563 of the constant period signal formation circuit 561 is set, the output terminal Q thereof changes to a high level, and the reset determination period signal RDS output from the inverting output terminal QB changes to a low level. The reset determination period signal RDS is supplied to the inverting reset terminal RB of the RS type flip-flop circuit 428 of the logic circuit 61.

Because of this, the RS type flip-flop circuit 428 is reset, and the pulse signal PS2 output from the output terminal Q thereof changes to a low level, as shown in FIG. 8(d). At this time, by the alarm base signal ALB output from the OR gate 444 also changing to a low level, the alarm signal AL is restored to a high level, as shown in FIG. 8(g).

Meanwhile, in the oscillator circuit 62, the RS type flip-flop circuit 563 is set by the determination period termination signal DTS changing to a high level. Because of this, the output signal output from the output terminal Q of the RS type flip-flop circuit 563 changes to a high level. Because of this, the PMOS-FET 577 of the time delay circuit 570 is put into an on condition, the NMOS-FET 578 is put into an off condition, and a charging of the charge and discharge capacitor 580 is started.

At the same time as this, the reset determination period signal RDS output from the inverting output terminal QB of the RS type flip-flop circuit 563 inverts to a low level, as shown in FIG. 8(f). At this time, assuming that the protection operation signal H2 maintains a high level, as shown in FIG. 8(b), the output signal of the NOR gate 423 of the logic circuit 61 maintains a low level, and the RS type flip-flop circuit 426 maintains the set condition without being reset.

Further, by the pulse signal PS2 changing to a low level, the PMOS-FET 527 of the determination period signal formation circuit 520 of the oscillator circuit 62 is put into an off condition, and the NMOS-FET 528 is put into an on condition. Because of this, the charge and discharge capacitor 530 is instantaneously discharged. Along with this, the determination period termination signal DTS2 changes to a low level, and the determination period termination signal DTS output from the OR gate 560 returns to a low level, as shown in FIG. 8(e).

Because of this, the output signal of the NOT circuit 562 inverts to a high level but, as the charging voltage Vc of the charge and discharge capacitor 580 does not reach the reference voltage Vref of the reference voltage supply 581, the output signal of the comparator 582 maintains a low level. As a result of this, the RS type flip-flop circuit 563 maintains the set condition.

Subsequently, when the charging voltage Vc of the charge and discharge capacitor 580 reaches the reference voltage Vref at a point t3 at which the certain period Tb elapses, the output signal of the comparator 582 changes to a high level. Because of this, the output signal of the NAND gate 564 changes to a low level, and the RS type flip-flop circuit 563 is reset.

Because of this, the reset determination period signal RDS output from the inverting output terminal QB of the RS type flip-flop circuit 563 inverts to a high level, as shown in FIG. 8(f). Because of this, the RS type flip-flop circuit 428 of the logic circuit 61 is set again, and the pulse signal PS2 output from the output terminal Q of the RS type flip-flop circuit 428 changes to a high level. Because of this, the alarm base signal ALB output from the OR gate 444 changes to a high level, and is supplied to the latch circuit 63.

Consequently, a high level gate control signal Gc is output from the AND gate 603 of the latch circuit 63, the NMOS-FET 112 of the alarm signal formation unit 64 is put into an on condition by the gate control signal Gc, and the alarm signal AL inverts to a low level, as shown in FIG. 8(g).

Because of this, the alarm signal AL, as shown in FIG. 8(g), is a one cycle pulse signal that is at a low level during the determination period Ta corresponding to the protection operation signal H2 output from the overcurrent protection circuit 52, and at a high level during the subsequent constant period Tb.

As the alarm signal AL is supplied to the control circuit 4 via the photocoupler 7, it is possible to measure the determination period Ta in the control circuit 4 by sampling the period from the alarm signal AL changing to a low level until changing to a high level, and it is thus possible to recognize that the overcurrent protection circuit 52 is in a protection operation condition based on the determination period Ta.

Further, in the control circuit 4, there are set timings at which the outputs of the drive signals DS are individually stopped in accordance with the protection circuits 51 to 53. For example, in the case of the overcurrent protection circuit 52, when the alarm signal AL is set in such a way as to stop the output of the drive signal DS when one determination period Ta elapses, the output of the drive signal DS is stopped at the point t2, as shown in FIG. 8(a). Because of this, the drive signal DS maintains a low level.

Subsequently, when the protection operation signal H2 output from the overcurrent protection circuit 52 continues at a high level, the alarm signal AL changes to a high level at a point t4 at which the determination period Ta elapses, and changes to a low level at a point t5 at which the subsequent constant period Tb elapses.

Then, for example, when a condition wherein overcurrent protection in the overcurrent protection circuit 52 is unnecessary is detected at a point t6 subsequent to the point t5, the protection operation signal H2 changes to a low level. However, the determination period termination signal DTS is at a low level at the point t6, as shown in FIG. 8(e). In response to this, the output of the NOT circuit 442 changes to a high level, and this is supplied to the NOR circuit 424 of the logic circuit 61.

Then, as the output of the NOR circuit 424 maintains a low level, the RS type flip-flop circuit 426 maintains the set condition, the output signal of the output terminal Q maintains a high level, and the RS type flip-flop circuit 426 maintains the set condition. Consequently, the protection operation condition signal acting as the protection operation flag output from the output terminal Q of the RS type flip-flop circuit 426 maintains a high level, as shown in FIG. 8(c).

Subsequently, when the determination period termination signal DTS inverts to a high level at a point t7, the output signal of the NOR circuit 424 of the logic circuit 61 changes to a high level. As the output signal is inverted in the NOR circuit 425, and supplied to the inverting reset terminal RB of the RS type flip-flop circuit 426, the RS type flip-flop circuit 426 is reset.

Because of this, the protection operation condition signal tFLG acting as the protection operation flag output from the output terminal Q of the RS type flip-flop circuit 426 changes to a low level, as shown in FIG. 8(c). At this time, the RS type flip-flop circuit 428 is also reset by the reset determination period signal RDS changing to a low level, the pulse signal PS2 output from the output terminal Q of the RS type flip-flop circuit 428 changes to a low level, as shown in FIG. 8(d), and the alarm base signal ALB changes to a low level.

As a result of this, the gate control signal Gc output from the AND gate 603 in the latch circuit 63 changes to a low level, the NMOS-FET 112 is put into an off condition, and the alarm signal AL returns to a high level.

When this condition is reached, as the RS type flip-flop circuits 416, 426, and 436 of the logic circuit 61 are all in a reset condition, the output signal of the NOR gate 441 changes to a high level. As the output signal is input into the NAND gates 413, 423, and 433, there is a return to a condition wherein the alarm signal AL based on the protection operation signals H1 to H3 can be emitted.

Because of this, when a condition wherein a protection operation is necessary in the low voltage protection circuit 51 is detected, the alarm signal AL is output by the same kind of operation as in the case of the overcurrent protection circuit 52, with the exception of a reduction in the length of the determination period Ta from the point at which the pulse signal PS1 output from the RS type flip-flop circuit 418 of the logic circuit 61 changes to a high level until the determination period termination signal DTS output from the determination period signal formation circuit 520 of the oscillator circuit 62 changes to a high level.

Consequently, in the control circuit 4, it is possible to recognize from the length of the determination period Ta that the low voltage protection circuit 51 is in a protection operation condition, and when the determination period Ta of the alarm signal AL is repeated a predetermined number of times, the output of the drive signal DS is stopped, and the drive signal DS changes to a high level.

In the same way, when a condition wherein a protection operation is necessary in the overheat protection circuit 53 is detected too, the alarm signal AL is output by the same kind of operation as in the case of the overcurrent protection circuit 52, with the exception of an increase in the length of the determination period Ta from the point at which the pulse signal PS3 output from the RS type flip-flop circuit 438 of the logic circuit 61 changes to a high level until the determination period termination signal DTS output from the determination period signal formation circuit 540 of the oscillator circuit 62 changes to a high level.

Consequently, in the control circuit 4, it is possible to recognize from the length of the determination period Ta that the overheat protection circuit 53 is in a protection operation condition, and when the determination period Ta of the alarm signal AL is repeated a predetermined number of times (for example, once), the output of the drive signal DS is stopped, and the drive signal DS changes to a high level.

Also, when one of the protection operation signals H1 to H3 of the protection circuits 51 to 53 changes to a high level in the driver IC 3UL, and one of the protection circuits 51 to 53 is in a protection operation condition in another of the driver ICs 3VL or 3WL, the protection operation condition determination signal PD changes to a high level, delayed by the delay time TD, in the protection operation condition determination circuit 65 when the alarm signal AL reaches the determination period Ta. Even in the event that the alarm base signal ALB is input into the latch circuit 63 from the driver IC 3UL during the delay time TD, the output signal output from the output terminal Q of the D type flip-flop circuit 602 changes to a low level. Because of this, the NMOS-FET 112 of the alarm signal formation unit 64 maintains an off condition, and does not affect the alarm signal AL output by the other driver IC 3VL or 3WL.

In this way, according to the first embodiment, when it is detected that a protection operation is necessary in one of the plural protection circuits 51 to 53, the protection circuit whose protection operation signal first changes to a high level is taken as a first-come first-served protection circuit. At this time, the output from the NAND gates 413 to 433 of setting signals that set the RS type flip-flop circuits 416 to 436 is prohibited by the output signal of the NOR gate 441.

Then, the alarm base signal ALB based on one of the pulse signals PS1 to PS3, wherein the determination period Ta corresponding to the first-come first-served protection circuit and the constant period Tb are combined, is formed, and the alarm signal AL is formed based on the alarm base signal ALB.

As a result of this, even in the event that a protection circuit other than the first-come first-served protection circuit is in a protection operation condition, it is possible to reliably prevent the alarm signal AL of the first-come first-served protection circuit from being affected, and it is thus possible to output an accurate alarm signal AL.

Moreover, even when forming plural driver ICs inside the same IC chip, and forming a single alarm signal terminal in the IC chip by collecting together the alarm terminals of the driver ICs, it is possible to prevent the alarm signals AL from being output overlapped from the plural driver ICs, and it is thus possible to accurately ascertain in the control circuit 4 which protection circuit is in a protection operation condition.

Also, the protection operation signals of the protection circuits 51 to 53 being in a low level condition, and the drive signal DS input from the control circuit 4 being in an output stopped condition, are set as alarm signal AL resetting conditions, and the determination of the resetting conditions is carried out during a period in which the pulse signals PS1 to PS3 are in the constant period Tb.

Because of this, as there is no effect on the determination period Ta when the resetting conditions are met, it is possible to accurately carry out the determination of the protection circuit. Conversely, with regard to the determination period Ta of the pulse signals PS1 to PS3, as there is no effect on the determination of the resetting conditions, it is possible to set an optional cycle, and it is thus possible to increase freedom of design. As a result of this, even in the event that the number of protection circuits increases to four or more, it is possible to freely set determination periods in which determination is possible, and it is thus possible to accurately determine which protection circuit is in a protection operation condition.

Also, in the control circuit 4, by measuring the determination period Ta of the input alarm signal AL, it is possible to accurately determine which protection circuit of the plural protection circuits 51 to 53 is in a protection operation condition.

Because of this, it is possible to change the timing at which the output of the drive signal DS is stopped for each protection circuit, and when the protection operation of a protection circuit requires urgency, it is possible to stop the output of the drive signal DS immediately at the point at which the first determination period Ta finishes and determination of the protection circuit becomes possible. Also, when urgency is not required, it is possible to stop the drive signal DS at a point at which the determination period Ta has been counted plural times, and it is thus possible to accurately determine the protection operation condition, thus reducing erroneous operations.

In the first embodiment, a description has been given of a case in which the alarm signal AL resetting conditions are that the protection operation signals are at a low level, and that the input drive signal DS is in an output stopped condition but, not being limited to this, it is possible to set the resetting conditions optionally. That is, it is also possible to make only at least the protection operation signals changing to a low level the resetting condition, to make meeting an all protection operations stopped condition, wherein all the protection operation signals are at a low level, the resetting condition, or to make all the protection operation signals in the plural driver ICs formed inside one IC chip being at a low level the resetting condition.

Also, in the first embodiment, a description has been given of a case in which the determination period Ta is varied by causing the reference voltages Vref1 to Vref3 of the reference voltage supplies 511, 531, and 551 to differ in the determination period signal formation circuits 500, 520, and 540. However, not being limited to the heretofore described configuration, the determination period Ta may also be varied by setting the capacitances of the charge and discharge capacitors 510, 530, and 550 to differing values. Furthermore, differing determination periods Ta may also be formed by applying a counter that counts clock pulses, and setting counter preset values to differing values.

Also, in the first embodiment, a description has been given of a case in which the driver ICs 3UL to 3WL that drive the lower arm IGBTs are formed inside one IC chip, but this is not limiting. That is, each driver IC may be formed inside an individual IC chip, a required number of driver ICs may be formed inside one IC chip, or all the driver ICs may be formed inside one IC chip.

Furthermore, in the first embodiment, a description has been given of a case in which the driver ICs 3UL to 3WU and control circuit 4 are connected by photocouplers, but this is not limiting. That is, the driver ICs 3UL to 3WU and control circuit 4 may be connected via an isolated signal transmission unit such as an isolating transformer.

Also, in the first embodiment, a description has been given of a case in which the pulse widths of the pulse signals PS1 to PS3 emitted in a pulse signal generating circuit 55 are set to basic pulse widths T, 2T, and 4T but, not being limited to this, it is possible to apply pulse signals of any pulse width, provided that they are differing pulse widths determinable in a control device.

Furthermore, in the first embodiment, a description has been given of a case in which the output of the gate drive signal Gi is stopped in the driver IC 3UL when the protection operation condition signal tFLG acting as the protection operation flag changes to a high level but, not being limited to this, the output of the gate drive signal Gi may be stopped when the determination period Ta has been measured a predetermined number of times, as in the control circuit 4.

Next, a description will be given, referring to FIGS. 10 and 11, of a second embodiment of the invention.

In the second embodiment, instead of the case of setting the determination periods of the pulse signals PS1 to PS3 to differing values, the numbers of pulses are set to differing values.

Figure 10:
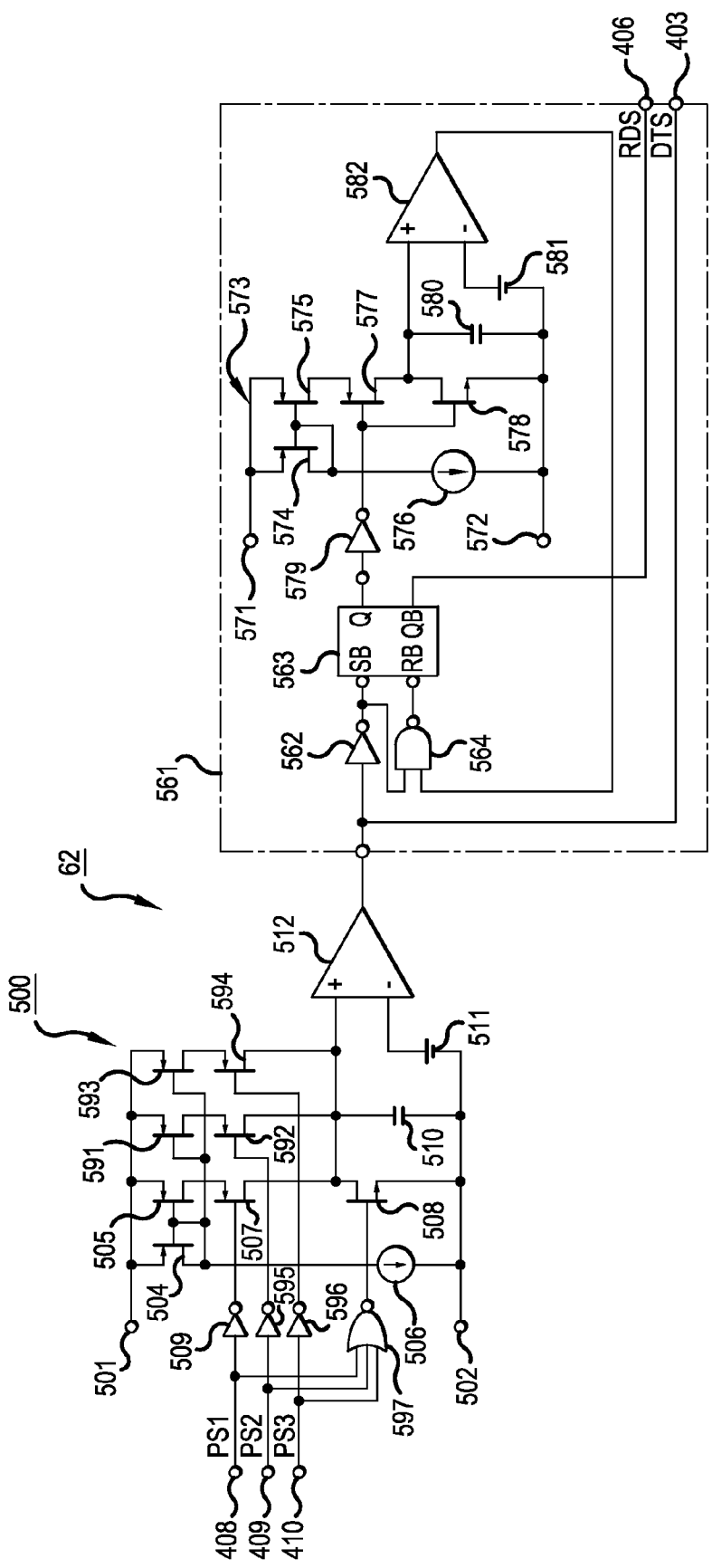
FIG. 10 is a block diagram showing a specific configuration of a logic circuit showing a second embodiment of the invention.

That is, in the second embodiment, the oscillator circuit 62 is configured as shown in FIG. 10.

In the oscillator circuit 62, the determination period signal formation circuits 520 and 540 of the first embodiment are omitted, and the configuration of the determination period signal formation circuit 500 is changed instead.

That is, as shown in FIG. 10, the determination period signal formation circuit 500 is such that a combination of a series circuit of PMOS-FETs 591 and 592 and a series circuit of PMOS-FETs 593 and 594 is connected in parallel to the PMOS-FETs 505 and 507 configuring a current mirror circuit.

Also, the gates of the PMOS-FETs 591 and 593 are connected to the gates of the PMOS-FETs 504 and 505, and the input terminals 409 and 410 and PMOS-FETs 592 and 594 are connected via NOT circuits 595 and 596.

Furthermore, connection points between the input terminals 408 to 410 and NOT circuits 509, 595, and 596 are connected to the input side of a NOR gate 597. Further, the output terminal of the NOR gate 597 is connected to the gate of the NMOS-FET 508.

Figure 11:
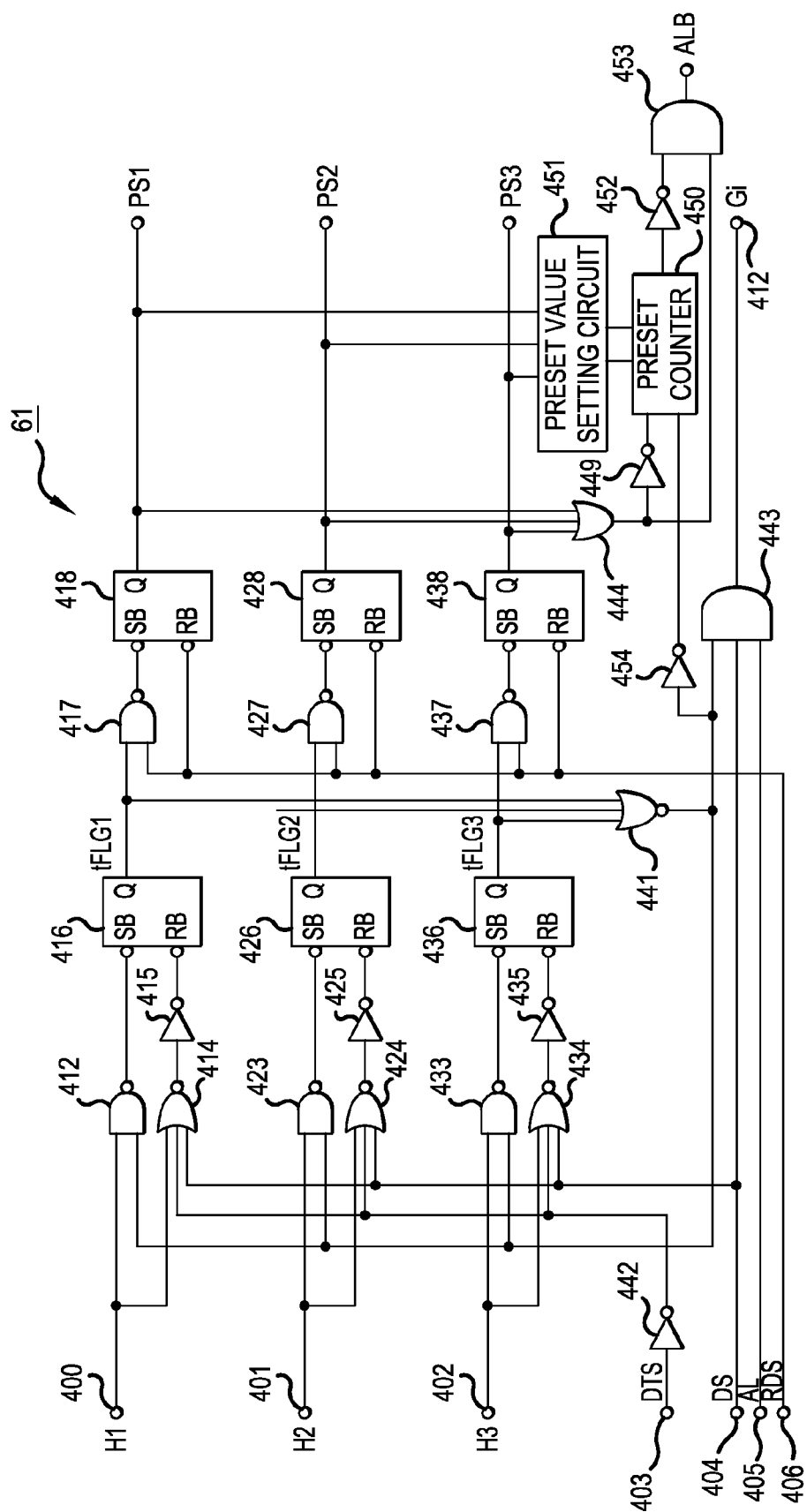
FIG. 11 is a block diagram showing a specific configuration of an oscillator circuit showing the second embodiment.

Meanwhile, in the logic circuit 61, the output signal of the OR gate 444 is supplied to a count signal input terminal of a preset counter 450 via a NOT circuit 449, as shown in FIG. 11. Also, the pulse signals PS1, PS2, and PS3 output from the RS type flip-flop circuits 418, 428, and 438 are input into a preset value setting circuit 451.

The preset value setting circuit 451 sets a preset value of, for example, "01" in two bits in the preset counter 450 when the pulse signal PS1 changes to a high level, sets a preset value of, for example, "10" in two bits in the preset counter 450 when the pulse signal PS2 changes to a high level, and sets a preset value of, for example, "11" in two bits in the preset counter 450 when the pulse signal PS3 changes to a high level.

Also, the output signal of the NOR gate 441 is input into a clear terminal of the preset counter 450. In the preset counter 450, the count details are cleared to zero on the output signal of the NOR gate 441 changing to a high level.

Furthermore, the preset counter 450 is such that the count increases when an inverted signal wherein the output signal of the OR gate 444 is inverted in the NOT circuit 449 rises from a low level to a high level, the output signal of the preset counter 450 is at a low level when the count value at the time is less than the preset value, and the output signal of the preset counter 450 is at a high level when the count value reaches the preset value.

The output signal of the preset counter 450 is input into one input side of an AND gate 453 via a NOT circuit 452. The output signal of the OR gate 444 is input into the other input side of the AND gate 453, and the alarm base signal ALB is output from the AND gate 453. The alarm base signal ALB is supplied to the latch circuit 63.

In the second embodiment, a high level minimum duration period is set whereby the protection operation signal H1 output from the low voltage protection circuit 51 continues at a high level for at least a period longer than one cycle of the determination period Ta, to be described hereafter. Also a high level minimum duration period is set whereby the protection operation signal H2 continues at a high level for at least a period longer than a period such that the constant period Tb is added to two cycles of the determination period Ta, to be described hereafter. Furthermore, a high level minimum duration period is set whereby the protection operation signal H3 continues at a high level for at least a period longer than a period such that twice the constant period Tb is added to three cycles of the determination period Ta, to be described hereafter.

In the second embodiment, the high level minimum duration periods of the protection operation signals H1 and H2 are set to be periods longer than a value of two cycles of the determination period Ta and the constant period Tb added together, and shorter than a period such that twice the constant period Tb is added to three cycles of the determination period Ta, while the high level minimum duration period of the protection operation signal H3 is set to be a period longer than a period such that twice the constant period Tb is added to three cycles of the determination period Ta.

According to the second embodiment, at a normal time when there is no detection of a condition wherein protection is needed in the low voltage protection circuit 51, overcurrent protection circuit 52, or overheat protection circuit 53, the drive signal DS input from the control circuit 4 is output via the AND gate 443 to the amplifier 42, in the same way as in the first embodiment. Further, the inverter 2 is driven by the gate drive signal Gi being supplied from the amplifier 42 to the gate of the IGBT 12 of the inverter 2, and direct current power is converted to alternating current power and supplied to the alternating current load 5.

When a condition wherein a protection operation is needed in one of the low voltage protection circuit 51, overcurrent protection circuit 52, or overheat protection circuit 53 is detected in this normal condition, it is assumed that one of the protection operation signals H1 to H3, H1 for example, has changed to a high level.

In this case, by the protection operation signal H1 changing to a high level, the RS type flip-flop circuit 416 of the logic circuit 61 is set, and the protection operation condition signal tFLG1 acting as the protection operation flag changes to a high level. Because of this, the RS type flip-flop circuit 418 is also set, and the pulse signal PS1 output from the output terminal Q of the RS type flip-flop circuit 418 changes to a high level.

At this time, in the same way as in the first embodiment, setting of each of the RS type flip-flop circuits 416, 426, and 436 is prohibited by the output of the NOR gate 441 changing to a low level.

Also, in the oscillator circuit 62, the PMOS-FET 507 of the determination period signal formation circuit 500 is put into an on condition, and the NMOS-FET 508 is put into an off condition, by the pulse signal PS1 changing to a high level. Because of this, the charge and discharge capacitor 510 is in a charging condition.

Also, on the protection operation condition signal tFLG1 output from the RS type flip-flop circuit 416 changing to a high level, the output signal of the NOR gate 441 changes to a low level and, by this output signal being inverted in the NOT circuit 454 and input into the clear terminal of the preset counter 450, the count details of the preset counter 450 are cleared to zero.

Meanwhile, in the preset value setting circuit 451, "01" is set as the preset value by the pulse signal PS1 changing to a high level and, as "01" is supplied to a preset input terminal of the preset counter 450, the preset value of the preset counter 450 is set to "1".

Subsequently, on the charging voltage of the charge and discharge capacitor 510 of the determination period signal formation circuit 500 of the oscillator circuit 62 reaching the reference voltage Vref1, a high level determination period termination signal DTS1 is output. The determination period termination signal DTS1 is supplied to the inverting set terminal SB of the RS type flip-flop circuit 563 via the NOT circuit 562. Because of this, the RS type flip-flop circuit 563 is set. As a result of this, in the same way as in the first embodiment, the reset determination period signal RDS changes to a low level, and the RS type flip-flop circuit 418 of the logic circuit 61 is reset.

Consequently, the pulse signal PS1 changes to a low level. Because of this, the output signal of the OR gate 444 changes to a low level, and this output signal is inverted in the NOT circuit 449 and input into the preset counter 450. Because of this, the count value of the preset counter 450 increases to "1", coinciding with the preset value.

Figure 12A:
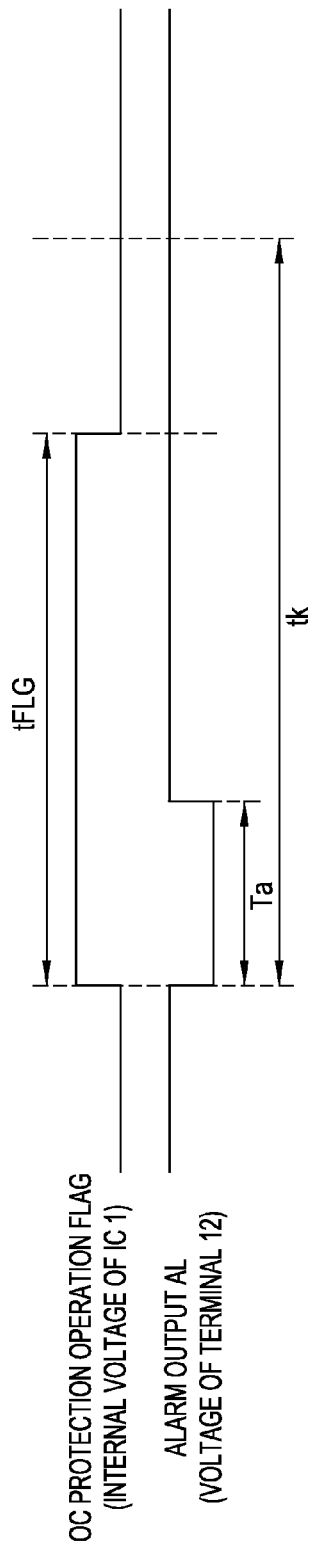
FIGS. 12(a)-12(c) are signal wave form diagrams showing alarm signals of the second embodiment.

Because of this, a high level output signal is output from the preset counter 450, the AND gate 453 closes, and the alarm base signal ALB changes to a low level. Because of this, the gate control signal Gc output from the latch circuit 63 changes to a low level, and the alarm signal AL changes to a high level, as shown in FIG. 12(a). Subsequently, as the output signal of the preset counter 450 maintains a high level, the alarm signal AL maintains a high level, as shown in FIG. 12(a).

Then, by the protection operation signal H1 changing to a low level and the drive signal DS changing to a low level, and furthermore, by the determination period termination signal DTS1 changing to a low level, the RS type flip-flop circuit 416 is reset, and the protection operation condition flag tFLG, acting as a protection operation flag, is reset as shown in FIG. 3(a).

Subsequently, on the reset determination period signal RDS changing to a high level, the RS type flip-flop circuit 418 is set but, as the AND gate 453 remains closed, the alarm signal AL maintains a high level.

Consequently, by an overcurrent protection operation starting and the protection operation signal H1 changing to a high level, one cycle of the determination period Ta is formed during a predetermined period tk set to be longer than three cycles of the alarm signal.

Then, by the overcurrent protection operation finishing, the protection operation signal H1 changing to a low level, and the drive signal DS changing to a low level, and furthermore, by the determination period termination signal DTS1 changing to a low level, the RS type flip-flop circuit 416 is reset, and the protection operation condition flag tFLG, acting as a protection operation flag, is reset as shown in FIG. 3(a).

Subsequently, on one of the protection operation signals H1 to H3 of one of the protection circuits 51 to 53 changing to a high level, one of the corresponding RS type flip-flop circuits 416, 426, or 436 is set.

Because of this, the protection operation condition flag tFLG, which is the protection operation flag, changes to a high level, because of which the output signal of the NOR gate 441 changes to a low level. Consequently, the preset counter 450 is cleared to zero, and the preset value is set in accordance with one of the pulse signals PS1 to PS3, which has changed to a high level.

Figure 12B:
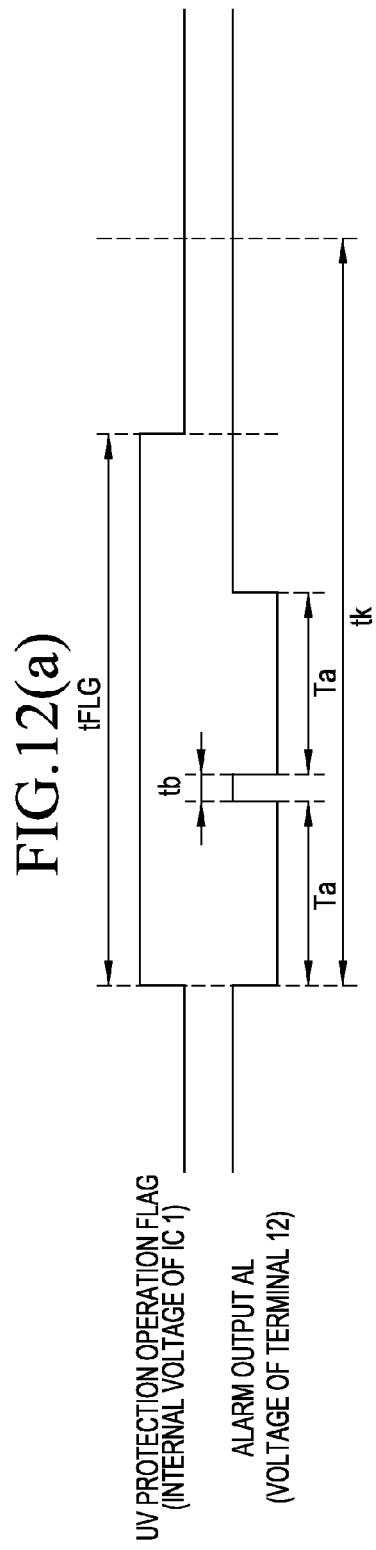

At this time, on the protection operation signal H2 of the overcurrent protection circuit 52 changing to a high level, the alarm signal AL is such that two cycles of the determination period Ta are output during the comparatively long predetermined period tk, as shown in FIG. 12(b).

Figure 12C:
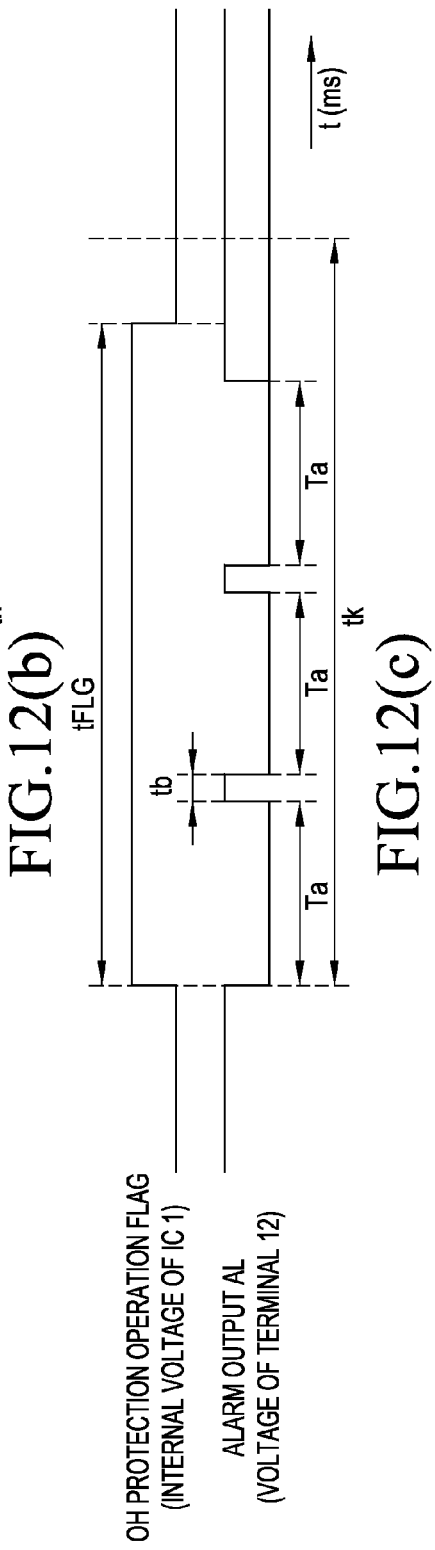

In the same way, on the protection operation signal H3 of the overheat protection circuit 53 changing to a high level, the alarm signal AL is such that three cycles of the determination period Ta are output during the comparatively long predetermined period tk, as shown in FIG. 12(c).

Consequently, by the alarm signal AL being read into the control circuit 4 via the photocoupler 7, it is possible to accurately recognize which of the protection circuits 51 to 53 is in a protection operation condition by counting the number of times the condition of the alarm signal AL changes from a low level to a high level.

At this time, in the control circuit 4, the alarm signal AL is sampled at the output timing of a clock pulse CP of a predetermined cycle, as shown in FIG. 13. By counting the number of times the condition of the sampled alarm signal AL changes from a low level to a high level from a timing at which the condition changes from a high level to a low level, it is possible to accurately detect the number of determination periods Ta. Then, it is possible to accurately determine from the number of determination periods Ta which of the protection circuits is in a protection operation condition.

In this case, by setting a cycle W1 of the clock pulse CP of the control circuit 4 to a value smaller than that of the constant period Tb of the alarm signal AL, it is possible to reliably detect a change in the condition of the alarm signal AL.

Also, it is preferable that the value of the determination period Ta is greater than 1 ms, as it is difficult to accurately detect a change in condition when the value of the determination period Ta is too small.

Also, it is preferable that the value of the constant period Tb with respect to the determination period Ta is set to a value smaller than one tenth, and it is preferable that a cycle Tc of the clock pulse CP in the control circuit 4 is set to one half or less of that of the constant period Tb.

Figure 14A:
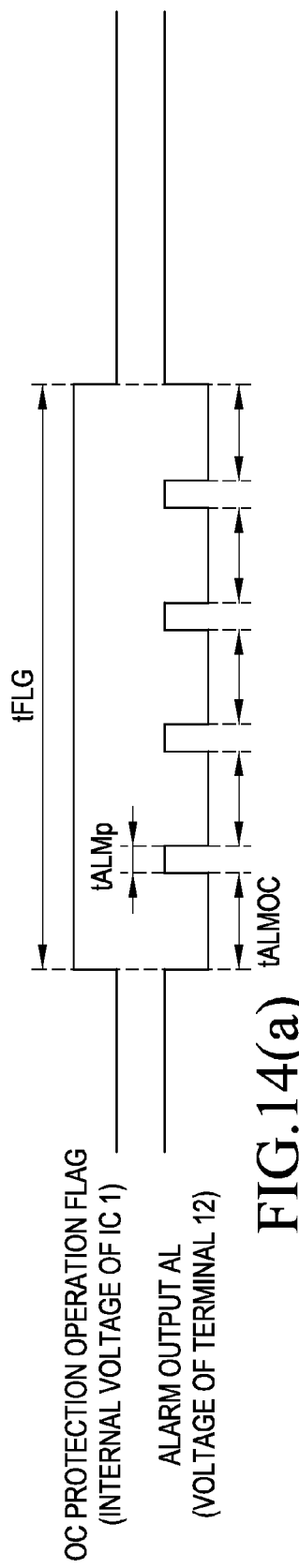
FIGS. 14(a)-14(c) are wave form diagrams showing alarm signals of differing cycles.
Figure 14B:
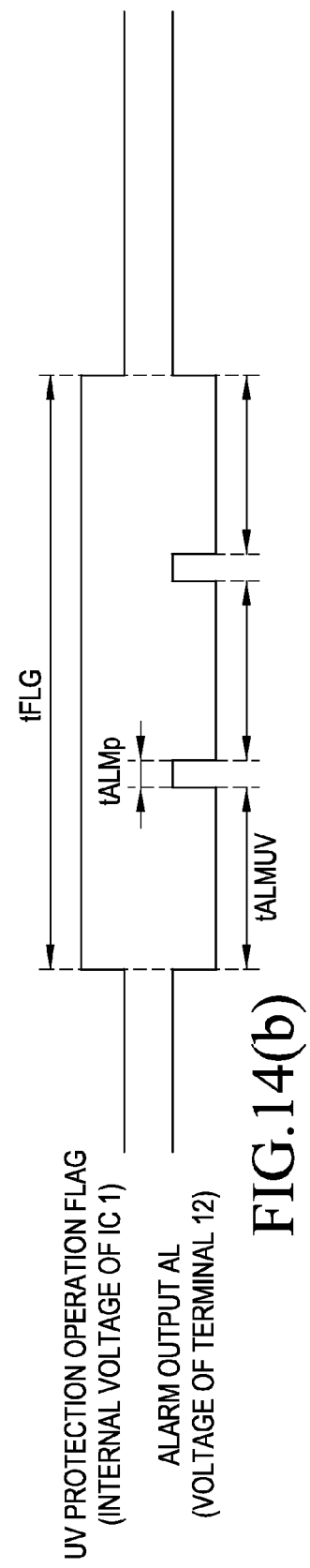
Figure 14C:
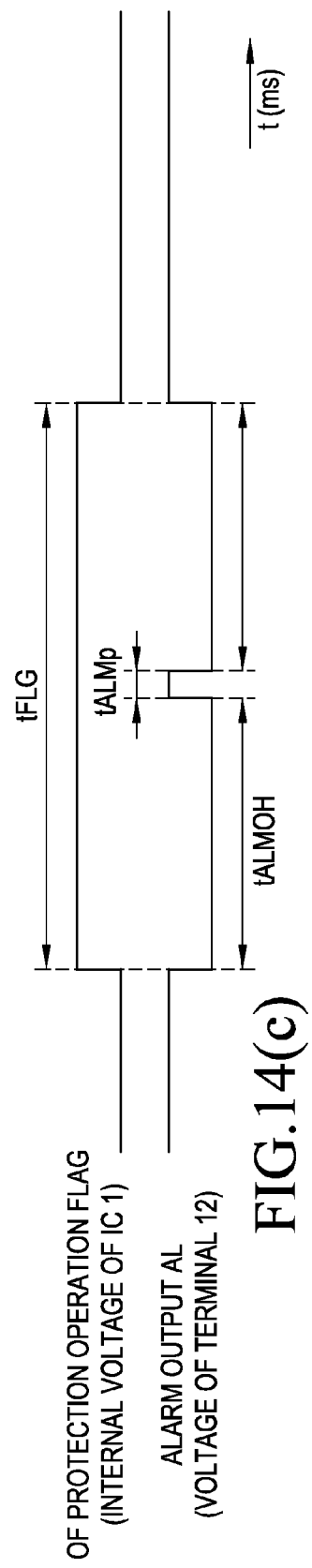

In this way, by counting the number of determination periods Ta, it is possible to reduce the effect of manufacturing variations. That is, as in the first embodiment, a case is supposed wherein the determination periods are, for example, a minimum determination period tALMOC at a time of an overcurrent protection operation, an intermediate determination period tALMUV at a time of a low voltage protection operation, and a maximum determination period tALMOH at a time of an overheat protection operation, as shown in FIGS. 14(a) to 14(c).

In this case, there is no problem when there is little manufacturing variation, as shown in FIG. 15(a), but when there is a great deal of manufacturing variation, as shown in FIG. 15(b), there is a problem in that the distribution of the determination periods tALMOC, tALMUV, and tALMOH exceeds the standard for determining the selection of good articles, the ratio of good articles worsens, and loss cost increases.

However, by making both the determination period Ta and constant period Tb constant values, and setting the number of times the determination period Ta is repeated to differing values, as in this embodiment, it is possible to form a determination period Ta with a differing number of repetitions for each protection circuit, using the same determination period signal formation circuit 500. Because of this, it is possible to suppress manufacturing variation, and it is thus possible to improve the ratio of good articles, and reduce loss cost.

In the second embodiment, a description has been given of a case in which the high level minimum duration periods of the protection operation signals H1 and H2 are set to be periods longer than a time of the constant period Tb added to two cycles of the determination period Ta, and shorter than a period such that twice the constant period Tb is added to three cycles of the determination period Ta, but the high level minimum duration periods of the protection operation signals H1, H2, and H3 can also be set to values that differ in accordance with the cycle of the set determination period Ta.

Also, in the first and second embodiments, a description has been given of a case in which an inverter is applied as a power conversion device but, not being limited to this, the invention can be applied to various kinds of power conversion device, such as an AC/DC converter that converts alternating current power to direct current power, a DC/DC converter, or an AC/AC converter. Also, a description has been given of a case in which the invention is applied to a three-phase power conversion device, but the invention can also be applied to a single-phase power conversion device.

Furthermore, in the first and second embodiments, a description has been given of a case in which the logic circuit 61, oscillator circuit 62, latch circuit 63, and protection operation condition determination circuit 65 are configured as hardware but, not being limited to this, it is also possible to carry out software processing by applying an arithmetic processing unit such as a microcomputer.

Also, in the first and second embodiments, a description has been given of a case in which the alarm signal AL is at a high level at a normal time but, not being limited to this, it is also possible to set in such a way that the alarm signal AL is at a low level at a normal time, and changes to a high level at a time of a protection operation. In this case, it is sufficient that the signal levels of the logic circuit 61, oscillator circuit 62, latch circuit 63, and the like, are inverted.

Furthermore, in the first and second embodiments, a description has been given of a case in which an IGBT is applied as a semiconductor element but, not being limited to this, it is possible to apply any power device, such as a power FET. Further, when applying a semiconductor element that can cause current to flow in two directions, it is possible to omit a freewheel diode.

Also, in the first and second embodiments, a description has been given of a case in which the device has the current sensing IGBT 17, and the current flowing through the IGBTs 11 to 16 is detected by the current sensing IGBT 17 but, not being limited to this, it is possible to detect the current utilizing a shunt resistor, or to detect the current utilizing a current transformer.

Furthermore, in the embodiments, a description has been given of a case in which a low voltage of the IC power supply and an overcurrent and overheat of the IGBT are detected but, not being limited to this, a configuration may be such that two kinds of the above-mentioned three kinds of protection operation are detected, and furthermore, a configuration may be such that a protection circuit that detects another condition necessitating a protection operation, such as an overvoltage, is provided.

Also, the switching elements configuring the protection operation condition determination circuit 65 not being limited to MOS-FETs, it is possible to apply other switching elements, such as bipolar transistors.

INDUSTRIAL APPLICABILITY

According to the invention, it is possible to provide a power conversion device control device with which it is possible to accurately determine the protection operation condition of plural protection circuits, with a simple configuration and with no erroneous detection.

What is claimed is:

1. A power conversion device control device, comprising:
a semiconductor element drive circuit that drives one of a plurality of semiconductor elements configuring a power conversion device based on a drive signal input from a control circuit;
a plurality of protection circuits that detect information necessary in order to carry out a protection operation of the semiconductor element; and
an alarm signal formation circuit, in which there is set a pulse signal having as one cycle a period in which are combined a determination period, of which a different period is set for each of the plurality of protection circuits, and a constant period whose condition varies with respect to the determination period, in which a protection circuit among the plurality of protection circuits for which it is first detected that a protection operation is necessary is taken as a first-come first-served protection circuit, and in which the pulse signal corresponding to the protection circuit is output as an alarm signal to an alarm signal terminal, wherein
the alarm signal formation circuit is such that a resetting condition of the alarm signal is a condition that a protection operation stopped condition, wherein it is detected that no protection operation is necessary in at least the first-come first-served protection circuit, is met, and a determination of the resetting condition is carried out during the constant period of the pulse signal.

2. The power conversion device control device according to claim 1, wherein the alarm signal formation circuit is such that a resetting condition of the alarm signal is a condition that a protection operation stopped condition, wherein it is detected that no protection operation is necessary in any of the protection circuits, is met, and a determination of the resetting condition is carried out during the constant period.

3. The power conversion device control device according to claim 1, wherein the alarm signal formation circuit is such that a resetting condition of the alarm signal is a condition that a protection operation stopped condition, wherein it is detected that no protection operation is necessary in the first-come first-served protection circuit, and a drive stop condition of the drive signal, are met, and a determination of the resetting condition is carried out during the constant period.

4. The power conversion device control device according to claim 1, wherein the alarm signal formation circuit is such that a resetting condition of the alarm signal is a condition that a protection operation stopped condition, wherein it is detected that no protection operation is necessary in any of the protection circuits, and a drive stop condition of the input drive signal, are met, and a determination of the resetting condition is carried out during the constant period.

5. The power conversion device control device according to claim 2, wherein the alarm signal formation circuit is configured in such a way that a protection operation flag is set between it being detected that a protection operation is necessary in the first-come first-served protection circuit and the resetting condition being met, an output signal to the semiconductor element of the driver circuit is stopped while the protection operation flag is set, and the alarm signal is output.

6. The power conversion device control device according to claim 1, wherein each of the plurality of driver circuits is configured of an identical IC chip, one alarm terminal is formed in the IC chip, and there is provided a function whereby voltage information of the alarm terminal is detected inside the IC chip, and it is determined, using the voltage information, whether or not to output the pulse signal corresponding to the first-come first-served protection circuit to the alarm signal terminal as an output alarm signal.

7. The power conversion device control device according to claim 1, wherein a plurality of the driver circuits is configured inside an identical IC chip, and the alarm signal terminals of each driver circuit are mutually connected by wire and connected to one alarm terminal formed in the IC chip.

8. The power conversion device control device according to claim 1, wherein all the driver circuits are configured inside an identical IC chip, and the alarm signal terminals of each driver circuit are mutually connected by wire and connected to one alarm terminal formed in the IC chip.

9. The power conversion device control device according to claim 1, wherein each driver circuit is connected via an isolated signal transmission unit to a control circuit that controls the power conversion device, an input drive signal is input from the control circuit via the isolated signal transmission unit, and an alarm signal is input via the isolated signal transmission unit into the control circuit.

10. The power conversion device control device according to claim 9, wherein the control circuit, when an alarm signal is input via the isolated signal transmission unit, counts the number of pulses of the alarm signal and, when the counted value reaches a setting value, stops the output of the drive signal to the driver circuit.

11. The power conversion device control device according to claim 9, wherein the control circuit, a pulse count setting value being set for each determination period of the alarm signal, measures the determination period of the alarm signal when the alarm signal is input via the isolated signal transmission unit, counts the number of pulses of the alarm signal and, when the counted number of pulses reaches the pulse count setting value of the determination period, stops the output of the drive signal to the driver circuit.

12. A power conversion device control device comprising:
a semiconductor element drive circuit that drives one of a plurality of semiconductor elements configuring a power conversion device based on a drive signal input from a control circuit;
a plurality of protection circuits that detect information necessary in order to carry out a protection operation of the semiconductor element; and
an alarm signal formation circuit, in which a reference pulse signal, having as one cycle a period in which are combined a first constant period and a second constant period whose condition varies with respect to the first constant period, is set for each of the plurality of protection circuits in such a way that a number of reference pulses emitted in a third constant period longer than the first and second constant periods differs, a protection circuit among the plurality of protection circuits for which it is first detected that a protection operation is necessary is taken as a first-come first-served protection circuit, and in which the pulse signal corresponding to the protection circuit is output as an alarm signal to an alarm signal terminal.

13. The power conversion device control device according to claim 12, wherein the first period is set to a value greater than 1 ms.

14. The power conversion device control device according to claim 12, wherein the second period is set to a value smaller than one tenth of that of the first period.

15. The power conversion device control device according to claim 12, wherein a timing cycle at which the control circuit reads in the alarm signal is set to a value smaller than that of the second period.

16. The power conversion device control device according to claim 12, wherein a timing cycle at which the control circuit reads in the alarm signal is set to a value half or less that of the second period.

17. The power conversion device control device according to claim 1, wherein the semiconductor element is configured of a unidirectional MOS gate device, and a freewheel diode is connected in parallel to the unidirectional MOS gate device.

18. The power conversion device control device according to claim 12, wherein the semiconductor element is configured of a unidirectional MOS gate device, and a freewheel diode is connected in parallel to the unidirectional MOS gate device.

19. The power conversion device control device according to claim 1, wherein the semiconductor element is configured of a bidirectional MOS gate device.

20. The power conversion device control device according to claim 12, wherein the semiconductor element is configured of a bidirectional MOS gate device.

* * * * *